United States Patent
Mollard et al.

(10) Patent No.: US 12,162,748 B2
(45) Date of Patent: Dec. 10, 2024

(54) ELECTROMECHANICAL MICROSYSTEM

(71) Applicant: COMMISSARIAT A L'ENERGIE ATOMIQUE ET AUX ENERGIES ALTERNATIVES, Paris (FR)

(72) Inventors: Laurent Mollard, Grenoble (FR); Stéphane Nicolas, Grenoble (FR); Damien Saint-Patrice, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 177 days.

(21) Appl. No.: 17/828,426

(22) Filed: May 31, 2022

(65) Prior Publication Data

US 2022/0380207 A1 Dec. 1, 2022

(30) Foreign Application Priority Data

May 31, 2021 (FR) ...................................... 21 05640

(51) Int. Cl.
*B81C 1/00* (2006.01)
*B81B 3/00* (2006.01)

(52) U.S. Cl.
CPC ........ *B81C 1/00158* (2013.01); *B81B 3/0021* (2013.01); *B81B 2203/0127* (2013.01); *H04R 2201/003* (2013.01)

(58) Field of Classification Search
CPC .................. H04R 19/005; H04R 2201/003
See application file for complete search history.

(56) References Cited

U.S. PATENT DOCUMENTS 6,811,133 B2 11/2004 Miles
10,302,897 B2 5/2019 Bolis
(Continued)

FOREIGN PATENT DOCUMENTS

CN 102818069 A 12/2012
CN 103016434 A 4/2013
(Continued)

OTHER PUBLICATIONS

Extended European Search Report issued on Oct. 18, 2022 in European Patent Application No. 22175725.5 (with English Translation of Category of Cited Documents), citing reference 1 therein, 8 pages.

(Continued)

*Primary Examiner* — Suhan Ni
(74) *Attorney, Agent, or Firm* — Oblon, McClelland, Maier & Neustadt, L.L.P.

(57) ABSTRACT

An electromechanical microsystem including two electromechanical transducers, a first deformable diaphragm and a cavity hermetically containing a deformable medium keeping a constant volume under the action of a change in the external pressure. The first diaphragm forms at least one portion of a first wall of the cavity and has a freely deformable area. The free area cooperates with an external member so that its deformation induces, or is induced by, a movement of the external member. The electromechanical transducers are configured so that a first electromechanical transducer forms a portion of the first wall of the cavity, and a second electromechanical transducer forms at least one portion of the wall opposite to the first wall of the cavity.

13 Claims, 14 Drawing Sheets

(56) References Cited

U.S. PATENT DOCUMENTS

| | | |
|---|---|---|
| 10,371,871 B2 | 8/2019 | Bolis |
| 2007/0058825 A1* | 3/2007 | Suzuki ................ H04R 19/005 |
| | | 381/174 |
| 2008/0212161 A1 | 9/2008 | Valette et al. |
| 2012/0006783 A1 | 1/2012 | Pouydebasque et al. |
| 2012/0049298 A1* | 3/2012 | Schlarmann .......... B81B 7/0048 |
| | | 438/51 |
| 2012/0069450 A1 | 3/2012 | Bolis |
| 2017/0017019 A1 | 1/2017 | Bolis |
| 2017/0045649 A1 | 2/2017 | Bolis |
| 2017/0108626 A1 | 4/2017 | Bolis |

FOREIGN PATENT DOCUMENTS

| | | |
|---|---|---|
| CN | 102878139 B | 5/2014 |
| CN | 107807255 B | 2/2020 |
| DE | 198 44 518 A1 | 4/2000 |
| EP | 3 120 171 B1 | 9/2019 |
| EP | 3 123 212 B1 | 6/2020 |
| EP | 3 304 138 B1 | 9/2020 |
| EP | 3 227 739 B1 | 8/2021 |
| WO | WO 2015/091834 A1 | 6/2015 |
| WO | WO 2015/091836 A1 | 6/2015 |

OTHER PUBLICATIONS

French Preliminary Search Report issued Feb. 18, 2022 in French Application 21 05640 filed on May 31, 2021, 9 pages (with English Translation of Categories of Cited Documents & Written Opinion).

* cited by examiner

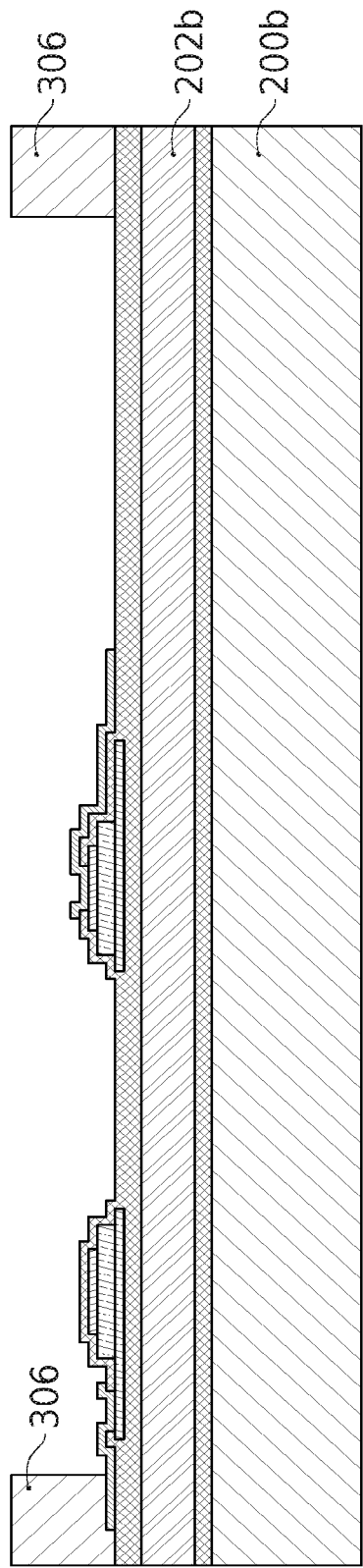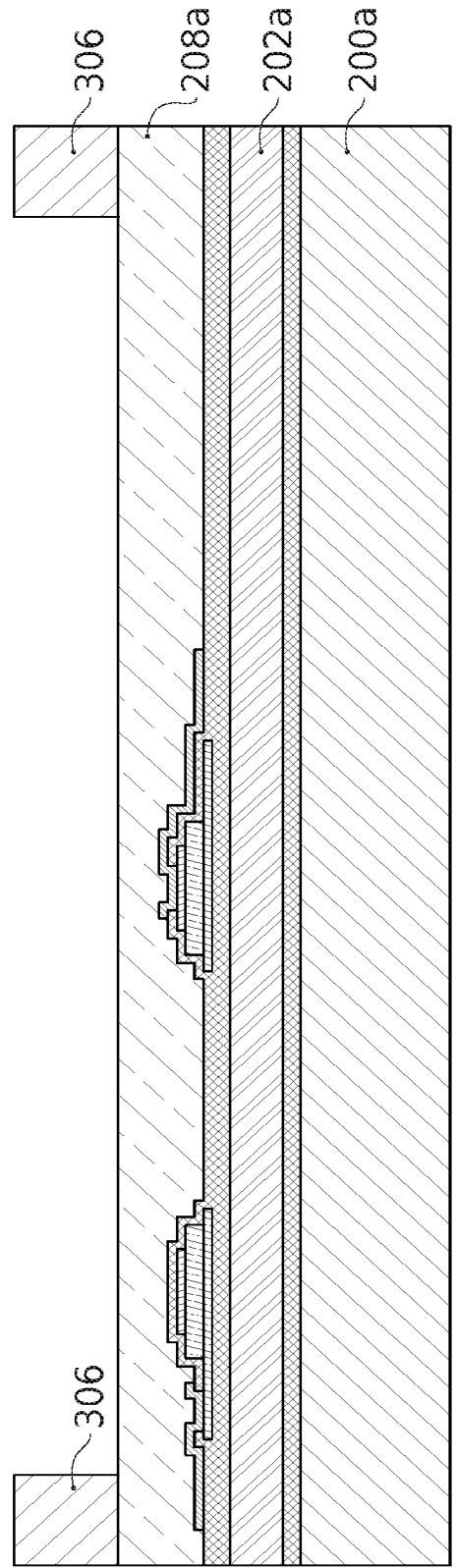

ELECTROMECHANICAL MICROSYSTEM

TECHNICAL FIELD

The present invention relates to the field of electromechanical microsystems. For example, it finds a particularly advantageous application in the actuation or the displacement of objects, including over relatively large distances. The invention also finds application in the field of contact detection. Thus, it could be implemented to make sensors.

PRIOR ART

In many applications, it might be needed to displace microscopic, and possibly nanoscopic, objects, and/or needed to detect the movements of such objects. There are microsystems that allow this.

In the case where these microsystems are actuators, their performances are assessed in particular on the following parameters: the amplitude of the movement, the exerted force and the accuracy of the generated movement. In the case where these microsystems are sensors, their performances are assessed in particular on their capability to detect a movement, in particular over a significant amplitude.

Moreover, whether the microsystems consist of actuators or sensors, what is aimed is that they offer good performances in terms of bulk, energy consumption and capability to work in frequency.

All known solutions have low performances for at least one of these parameters. In general, the existing microsystems have performances that are too unsatisfactory for a combination of these parameters.

An object of the present invention is to provide an electromechanical microsystem which has improved performances in comparison with the existing solutions, at least for one of the above-mentioned parameters, or which has a better trade-off between at least two of the aforementioned parameters.

An object of the present invention is to provide an electromechanical microsystem allowing a dual actuation.

The other objects, features and advantages of the present invention will appear upon examining the following description and the appended drawings. It goes without saying that other advantages could be incorporated.

SUMMARY

To achieve this objective, according to one embodiment, an electromechanical microsystem is provided comprising:
  at least two electromechanical transducers each comprising a portion movable between a balance position, off-load, and an out-of-balance position, under load,
  a first deformable diaphragm,
  a deformable cavity formed by walls, the walls being configured to hermetically contain a deformable medium capable of keeping a substantially constant volume under the action of a change in the external pressure.

At least one portion of the first deformable diaphragm forms at least one portion of a first wall selected amongst said walls of the cavity. The movable portion of each electromechanical transducer is configured so that its movement depends on said change in the external pressure and vice versa. Said at least one portion of the first deformable diaphragm has at least one area freely deformable as a function of said change in the external pressure.

A first electromechanical transducer forms a portion of said first wall of the cavity, and a second electromechanical transducer forms at least one portion of the wall opposite to said first wall of the cavity.

According to alternative examples:
  the free area of the first diaphragm is configured to cooperate with at least one external member so that its deformation induces, or is induced by, a movement of the external member, or
  the free area of the first diaphragm is configured to form a wall of a second cavity extending from the first cavity so that its deformation induces an overpressure or a depression in the second cavity, when the latter is obstructed by an external member.

The main advantages of the microsystem as introduced hereinabove are discussed hereinbelow in the context of a displacement of an external member. It should be understood that such advantages could also be stated in the context of holding or releasing an external member from the aforementioned second cavity.

The provided solution enables the electromechanical microsystem to form an actuator enabling dual actuation, and more particularly actuation on each of the two opposite faces of the electromechanical microsystem, and that being so while featuring, in a way that could be easily modulated depending on the targeted applications, a sufficient capability in terms of displacement amplitude and/or a sufficient capability in terms of deployed force and/or a capability to detect movement, in particular over a large amplitude, and/or a sufficient capability to work in frequency and/or a size compatible with the targeted applications, and/or a reduced energy consumption.

The suggested solution also enables the electromechanical microsystem to form a so-called large-stroke actuator, i.e. typically enabling the displacement of the external member over a travel length of at least 30 µm, and possibly 100 µm ($10^{-6}$ metres). Similarly, the suggested solution enables the electromechanical microsystem to form a so-called large-stroke sensor, typically allowing detecting a displacement whose displacement is at least 30 µm, and possibly 100 µm ($10^{-6}$ metres).

According to one example, the movable portion of each electromechanical transducer is preferably configured so that loading thereof or an increase in the external pressure induces a movement thereof towards the outside of the cavity, and more particularly opposite to at least one wall of the cavity different from, preferably opposite to, the first wall.

Alternatively to the previous example, the movable portion of each electromechanical transducer is preferably configured so that loading thereof or a decrease in the external pressure induces a movement thereof towards the inside of the cavity, and more particularly opposite to at least one wall of the cavity different from, preferably opposite to, the first wall.

The suggested solution according to any of the alternative preferences hereinabove enables the electromechanical microsystem to form an actuator enabling a substantially duplicated actuation, and more particularly over a substantially duplicated amplitude.

According to one example, the microsystem may further comprise a second deformable diaphragm at least one portion of which forms at least one portion of a wall opposite to said first wall of the cavity, said at least one portion of the second deformable diaphragm having at least one freely-deformable area, preferably elastically, as a function of said change in the external pressure.

The provided solution according to the previous example enables the electromechanical microsystem to form a dual actuator enabling actuation on two opposite faces of the electromechanical microsystem.

Another aspect of the invention relates to an opto-electro-mechanical system or microsystem comprising at least one electromechanical microsystem as introduced hereinabove and at least one optical microsystem.

Another aspect of the invention relates to a method for manufacturing an electromechanical microsystem as introduced hereinabove, comprising, and possibly being limited to, deposition and etching steps, quite common in the microelectronics industry. Indeed, the electromechanical microsystem may be manufactured by common means of the microelectronics industry, which confers on its manufacturer all of the advantages resulting from the use of these means, including a great flexibility in terms of sizing, energy of adhesion between the different deposits, thickness of the different deposits, extent of etching, etc.

According to one example, the method for manufacturing the electromechanical microsystem comprises the following steps:
 a step of forming, over a first substrate, at least one portion of the first electromechanical transducer and of the first deformable diaphragm, and
 a step of forming, over a second substrate, at least one portion of the second electromechanical transducer, then
 a step of forming an open cavity over the first deformable diaphragm by affixing the second substrate on the first substrate, then
 a step of filling with the deformable medium and closing the cavity, and
 a step of etching the first and second substrates to form, respectively, a front face (FAV) and a rear face (FAR) of the electromechanical microsystem.

BRIEF DESCRIPTION OF THE FIGURES

The aims, objects, as well as the features and advantages of the invention will appear better from the detailed description of an embodiment of the latter which is illustrated by the following appended drawings wherein:

FIGS. 7A to 10A schematically represent a sectional view or a section of the electromechanical microsystem according to the first embodiment of the invention at different steps of the end of their manufacturing process.

FIGS. 7B to 10B schematically represent a sectional view or a section of the electromechanical microsystem according to the second embodiment of the invention at different steps of the end of their manufacturing process.

Figure 1A:
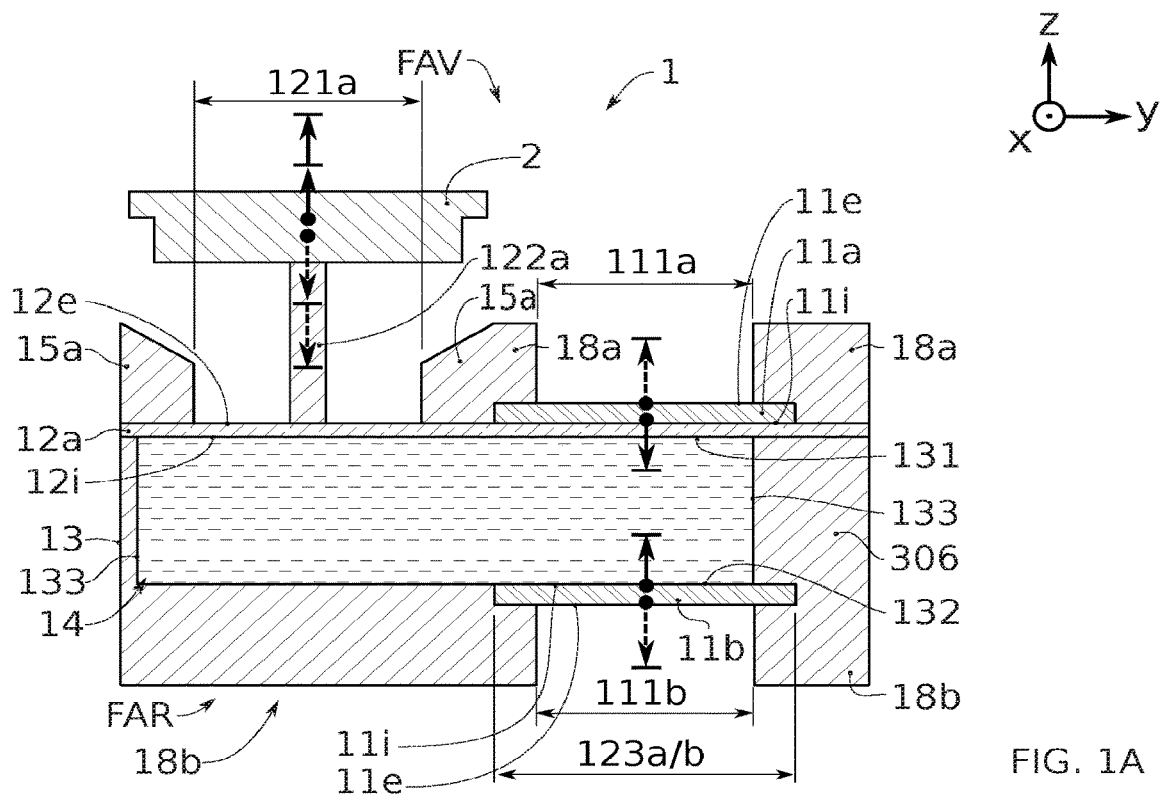
FIG. 1A is a block diagram of a sectional view or of a section of an electromechanical microsystem according to a first embodiment of the invention.

The drawings are provided as examples and do not limit the invention. They consist of schematic principle representations intended to facilitate understanding of the invention and are not necessarily to the scale of practical applications. In particular, the thicknesses of the different illustrated layers, walls and members do not necessarily represent reality.

DETAILED DESCRIPTION

Before starting a detailed review of embodiments of the invention, optional features that could possibly be used in combination or alternatively are set out hereinafter.

According to one example, the first electromechanical transducer may extend, directly or indirectly, over the first deformable diaphragm.

According to one example, the first electromechanical transducer extends around the free area of the first deformable diaphragm. The first electromechanical transducer may have an annular shape whose circular centre defines the extent of the free area of the first deformable diaphragm.

Alternatively to the previous example, the first electromechanical transducer extends in a solid area, for example circular, separate from the free area of the first deformable diaphragm. The first electromechanical transducer may have an annular shape.

According to one example, in the case where the electromechanical microsystem comprises a second deformable diaphragm, the second electromechanical transducer extends, directly or indirectly, over the second deformable diaphragm.

Alternatively or complementarily to the previous example:
 the second electromechanical transducer extends around the free area of the second deformable diaphragm, the second electromechanical transducer may have an annular shape whose circular centre defines the extent of the free area of the second deformable diaphragm; or
 the second electromechanical transducer extends in a solid area, for example circular, separate from the free area of the second deformable diaphragm, the second electromechanical transducer may have an annular shape.

According to one example, the free area of the second diaphragm is configured to cooperate with an external member, so that its deformation induces, or is induced by, a movement of the external member. Alternatively, the free area of the second diaphragm is configured to form a wall of a third cavity extending from the first cavity so that its deformation induces an overpressure or a depression in the third cavity, when the latter is obstructed by an external member. The external member with which the free area of the second diaphragm is configured to cooperate is potentially different from the external member with which the free area of the first diaphragm is configured to cooperate.

According to one example, the first electromechanical transducer and the second electromechanical transducer are located opposite each other. Alternatively or complementarily, the free area of the first deformable diaphragm and the free area of the second deformable diaphragm are located opposite each other.

Alternatively to the previous example, the free area of the first deformable diaphragm and the second electromechanical transducer are located opposite each other and the free area of the second deformable diaphragm and the first electromechanical transducer are located opposite each other.

Thus, the microsystem according to these last features comes in various geometries, allowing achieving at least as many different operations, in particular while allowing exploiting various vibratory dynamics.

According to one example, the free area of each deformable diaphragm is configured to cooperate with at least one external member via at least one pin fastened on said free area, preferably in contact with said free area and more specifically in contact with an outer face of the free area.

The pin may be fastened at the centre of the free area of the deformable diaphragm on which it is fastened. In this manner, it is ensured that the movement of the pin is a translational movement perpendicular to the wall of the cavity which is partially formed by the deformable diaphragm.

The pin may be configured to cooperate with the external member through a guide secured to the external member, so as to enable an automatic positioning of the external member on the pin.

Each pin may be configured so as to be able to be secured to the external member by gluing or magnetically, the adhesive energy of the pin on the free area of the deformable diaphragm being preferably higher than that of the pin on the external member. An attachment, possibly removable, of the pin and of the external member is thus provided for which is could be greatly modulated in terms of holding force.

Each electromechanical transducer may be configured so that a movement of its movable portion from its balance position to its off-balance position induces an increase in the external pressure acting on the deformable medium and each deformable diaphragm may be configured so that an increase in the external pressure acting on the deformable medium induces a deformation of the free area of the deformable diaphragm tending to separate it from the cavity (more specifically to separate it from a wall of the cavity opposite to the wall formed at least partially by a portion of the diaphragm). Thus, the electromechanical microsystem is configured so as to induce a displacement of the external member in a first direction, corresponding to a separation of the external member with respect to the cavity.

Alternatively to the previous feature, each electromechanical transducer may be configured so that a movement of its movable portion from its balance position to its off-balance position induces a decrease in the external pressure acting on the deformable medium and each deformable diaphragm may be configured so that a decrease in the external pressure acting on the deformable medium induces a deformation of the free area of the deformable diaphragm tending to bring it close to the cavity (more specifically to bring it close to a wall of the cavity opposite to the wall formed at least partially by a portion of the diaphragm). Thus, the electromechanical microsystem is configured so as to induce a displacement of the external member in a second direction, corresponding to an approach of the external member with respect to the cavity.

According to one example, at least the movable portion of each electromechanical transducer may be secured to an area of the deformable diaphragm over which it extends, so that a movement of the movable portion of the electromechanical transducer induces a corresponding movement of said area of the deformable diaphragm.

Preferably, each deformable diaphragm is configured so that its free area could be deformed with an amplitude of at least 50 µm, possibly of at least 100 µm, and possibly of at least 1,000 µm according to a direction perpendicular to the plane in which it primarily extends when it is at rest. Thus, without tearing and/or without any significant wear, the electromechanical microsystem offers the ability to address numerous and various application requiring a large stroke, the latter being defined where appropriate by the considered technical field.

The movable portion of each electromechanical transducer may have a surface at least twice as large, and possibly five times larger, and preferably at least ten times larger than the surface of the free area of at least one, possibly of each, deformable diaphragm, and possibly than the surface of the free areas of the deformable diaphragm. The larger the surface of the transducer in comparison with the surface of the free area, the higher will be the amplitude of deformation of the free area of the diaphragm.

According to one example, the electromechanical microsystem may further comprise at least one lateral stop configured to guide the movement of an external member, when the free area is configured to cooperate with said external member so that its deformation induces, or is induced by, a movement of the external member.

Said at least one lateral stop may be supported by the wall of the cavity which is partially formed by the deformable diaphragm. According to an optional example, said lateral stop extends opposite to the cavity.

Alternatively or complementarily to the previous example, when the free area is configured to form a wall of a second cavity extending from a first cavity so that its deformation induces an overpressure or a depression in the second cavity obstructed by an external member, said at least one lateral stop may be configured to form all or part of one or several other wall(s) of the second cavity.

Thus, it is possible to:
limit the inclination of the pin during the movement of the movable portion of the electromechanical transducer, and/or
enable a self-positioning of the external member with respect to the free area of the deformable diaphragm, and/or
protect the deformable diaphragm, and more particularly its free area, in particular from a possible pull-out, when affixing or gluing the external member.

According to one example, in the case where the free area of the deformable diaphragm is configured to cooperate with the external member via the pin fastened on said free area, the pin may extend from the free area of the deformable diaphragm beyond said at least one lateral stop. Alternatively, the pin may extend from the free area of the deformable diaphragm short within said at least one lateral stop. The electromechanical microsystem according to either one of these two features offers a satisfactory capability to adapt to a wide range of external members and applications.

At least one, preferably each, electromechanical transducer is a piezoelectric transducer, preferably comprising a PZT-based piezoelectric material.

At least one, preferably each, electromechanical transducer may be a transducer with a static operation. Alternatively or complementarily, at least one, preferably each, electromechanical transducer may be a transducer with a vibratory operation at least at one resonance frequency, said at least one resonance frequency being preferably lower than 100 kHz, and even more preferably lower than 1 kHz.

The deformable medium hermetically contained in the cavity may comprise at least one amongst a fluid and/or a liquid, preferably having a viscosity in the range of 100 cSt at ambient temperature and pressure.

According to a non-limiting embodiment, the deformable medium has a compressibility comprised between $10^{-9}$ and $10^{-10}$ Pa$^{-1}$ at 20° C., for example in the range of $10^{-10}$ Pa$^{-1}$ at 20° C., without these values being restrictive.

The electromechanical microsystem as introduced hereinabove may further comprise a plurality of free areas per deformable diaphragm.

Preferably, the electromechanical microsystem as introduced hereinabove is devoid of any optical element, such as a lens, in particular a variable-focus one.

Said at least one optical microsystem of the opto-electromechanical microsystem as introduced hereinabove may comprise at least one mirror also referred to as micro-mirror, preferably silicon-based.

According to one example, the opto-electro-mechanical system is configured so that the movement of the movable portion of each electromechanical transducer causes a displacement of the at least one mirror.

Alternatively or complementarily, the opto-electro-mechanical system may comprise a plurality of electromechanical microsystems each having a free area arranged opposite a portion of the same optical microsystem, this portion being specific thereto and being preferably a corner of said optical microsystem. Thus, an opto-electro-mechanical system or microsystem benefiting from a great capability of adaptation of its optical orientation is obtained.

By "electromechanical microsystem", it should be understood comprising at least one mechanical element and at least one electromechanical transducer made in the micrometric scale with means of the microelectronics industry. The electromechanical transducer could detect a movement of the mechanical element; the electromechanical microsystem then serves as a sensor. Alternatively or complementarily, the mechanical element could be set in movement (actuated) thanks to a force generated by the electromechanical transducer. The latter may be powered by electric voltages produced with neighbouring electronic circuits.

A "microsystem" is a system whose outer dimensions are smaller than 1 centimetre ($10^{-2}$ metres) and preferably than 1 millimetre ($10^{-3}$ metres).

Most often, an electromechanical transducer serves as an interface between the mechanical and electrical domains. Nonetheless, by "electromechanical transducer", it should herein be understood a piezoelectric transducer, as well as a thermal transducer, the latter serving as an interface between the mechanical and thermal domains. An electromechanical transducer may comprise a movable portion between a balance position, off-load, and an out-of-balance position, under load. In the case where the transducer is piezoelectric, the load is electric. In the case where the transducer is thermal, the load is thermal.

When mention is made of the centre of the cavity, this centre is defined geometrically by considering the centre of a cavity having a non-deformed free area of the deformable diaphragm.

By "lower" and "higher", it should be understood "lower than or equal to" and "higher than or equal to", respectively. Equality is excluded by the use of the terms "strictly lower" and "strictly higher".

By a parameter "substantially equal to/higher than/lower than" a given value, it should be understood that this parameter is equal to/higher than/lower than the given value, more or less 20%, possibly 10%, of this value. By a parameter "substantially comprised between" two given values, it should be understood that this parameter is at least equal to the lowest given value, more or less 20%, possibly 10%, of this value, and at most equal to the highest given value more or less 20%, possibly 10%, of this value.

Figure 1B:
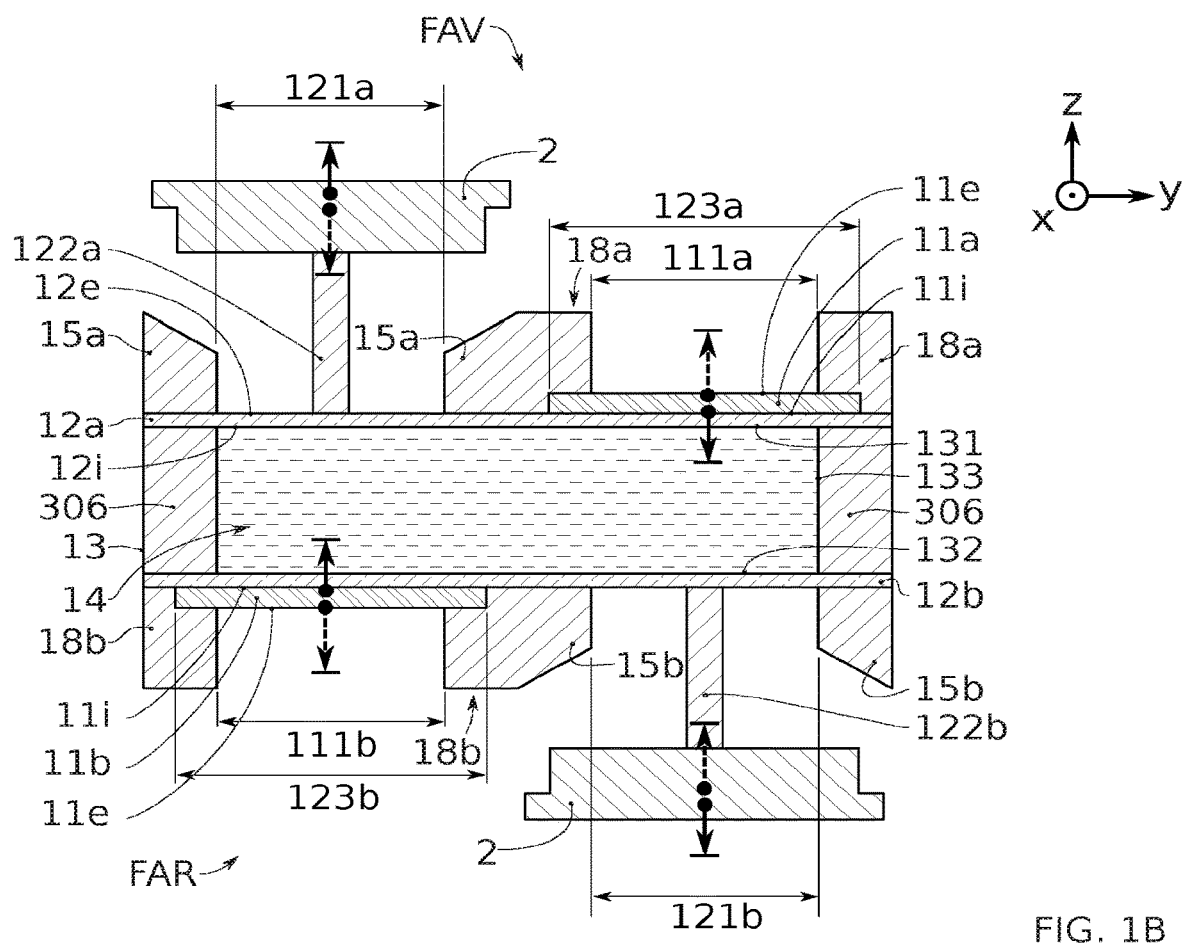
FIG. 1B is a block diagram of a sectional view of an electromechanical microsystem according to a second embodiment of the invention.
Figure 1C:
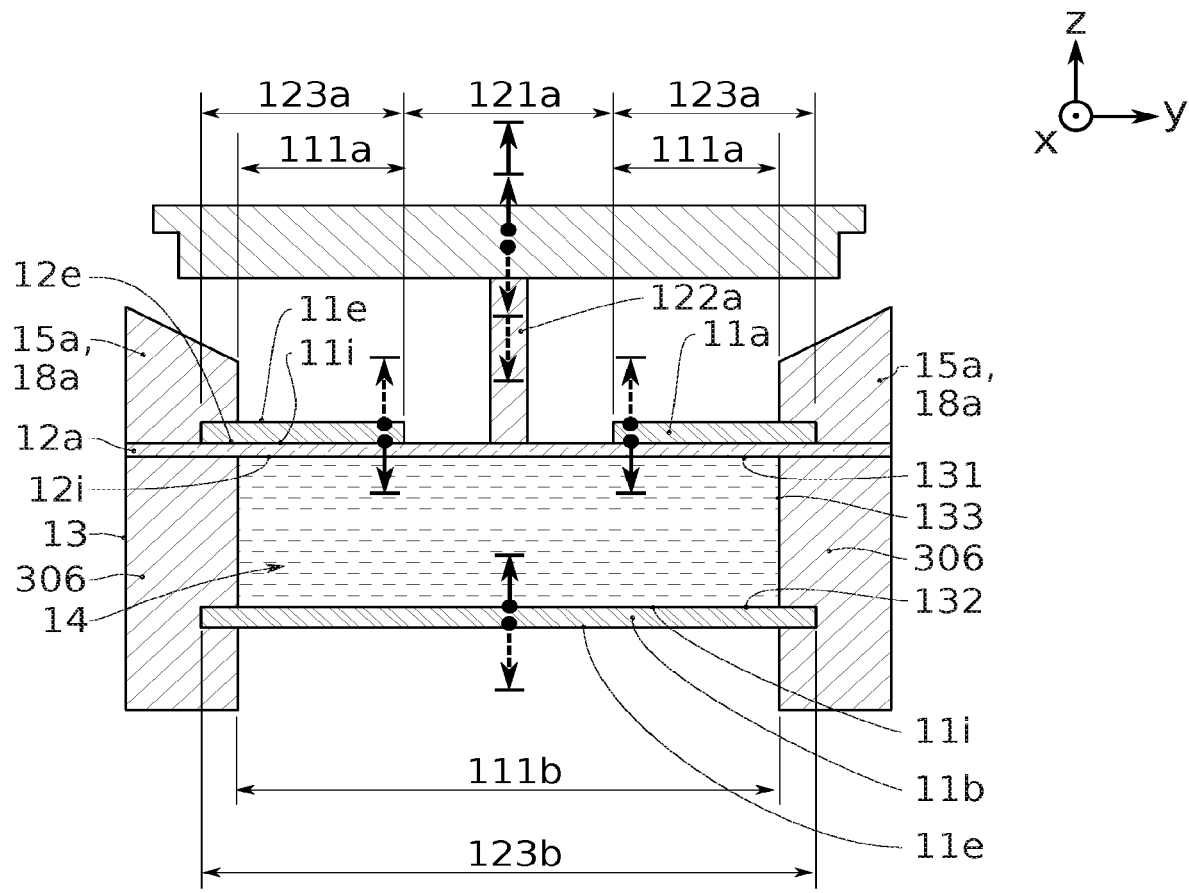
FIG. 1C is a block diagram of a sectional view or of a section of an electromechanical microsystem according to a third embodiment of the invention.

FIGS. 1A, 1B and 1C are block diagrams of a sectional view or of a section of an electromechanical microsystem 1 according to the first, second and third embodiments of the invention, respectively. In each of FIGS. 1A to 1C, two electromechanical transducers 11a and 11b, a first deformable diaphragm 12a and a cavity 13 configured to hermetically contain a deformable medium 14, are illustrated.

Each of the block diagrams 1A and 1B may represent a structure with no rotational symmetry or axisymmetry around an axis perpendicular and centred with respect to the surface of the first deformable diaphragm 12 as illustrated, as well as a structure extending, for example in a substantially invariable manner, perpendicularly to the illustrated section and symmetrical for a first portion with respect to a perpendicular plane centred with respect to the area bearing the reference 121a and for a second portion with respect to a perpendicular plane centred with respect to the area bearing the reference 111a.

The block diagram 1C may represent a structure with a rotational symmetry or an axisymmetry around a perpendicular axis centred with respect to the surface of the first deformable diaphragm 12a as illustrated, as well as a structure extending, for example in a substantially invariable manner, perpendicularly to the illustrated section and symmetrical with respect to a perpendicular plane centred with respect to the area bearing the reference 121a.

Before describing even further the different embodiments of the invention illustrated in the appended figures, note that each of these illustrations schematically represents an embodiment of the electromechanical microsystem according to the invention which has a through structure. More particularly, in the different illustrated embodiments, the two electromechanical transducers 11a and 11b are located on opposite faces (FAV for the front face and FAR for the rear face) of the electromechanical microsystem 1.

Each electromechanical transducer 11a, 11b comprises a movable portion 111a, 111b. The latter is configured so as to move or be moved between at least two positions. A first one of these positions is in a balance position reached and held when the electromechanical transducer 11a, 11b is not loaded, for example whether by an electric voltage or by a force urging it off its balance position. A second position of the movable portion 111a, 111b of each electromechanical transducer 11a, 11b is reached when the electromechanical transducer 11a, 11b is loaded, for example whether by an electric voltage or by a force urging it off its balance position. Each electromechanical transducer 11a, 11b could be kept in either one of the above-described first and second positions, and thus have a binary behaviour, or could further be kept in any intermediate position between its balance position and its largest deformation position, with respect to equilibrium.

In the embodiments illustrated in FIGS. 1A to 1C, when an electromechanical transducer 11a, 11b is not loaded, its movable portion 111a, 111b extends primarily in a plane parallel to the plane xy of the orthogonal reference frame xyz illustrated in these figures.

Preferably, each electromechanical transducer 11a, 11b is a piezoelectric transducer. In a known manner, such a transducer converts a supplied electrical energy into a movement of its movable portion 111a, 111b from its balance position to an off-balance position and/or converts a movement of its movable portion 111a, 111b, from its balance position to an off-balance position, into an electric signal. Hence, it arises from this example, yet this remains potentially true for each of the other considered embodiments of each electromechanical transducer 11a, 11b, that the electromechanical microsystem 1 according to the invention could operate as an actuator and/or as a sensor. As an actuator, it could allow displacing an external member 2 upwards or downwards, as illustrated in FIGS. 1A to 1C. As a sensor, it could allow detecting a displacement, in particular a vertical displacement, of the external member 2 as illustrated in FIGS. 1A to 1C. Below, for simplicity, we essentially describe the electromechanical microsystem 1 as an actuator, yet without excluding its ability to ensure, alternatively or complementarily, a sensor function.

Even more preferably, each electromechanical transducer 11a, 11b is a piezoelectric transducer comprising a PZT-based (lead zirconate titanate) piezoelectric material. In this case, the movable portion 111a, 111b of the electromechanical transducer 11a, 11b could, under load, move with a more significant displacement (because of the piezoelectric coefficient d31) than with many other piezoelectric materials. Nonetheless, PZT being a ferroelectric material, each of such piezoelectric transducers preferably operates in one single actuation direction (movement of their movable portion 111a, 111b in one direction) irrespective of the polarity of its electric power supply, while a piezoelectric transducer based on a non-ferroelectric material could preferably operate in both directions (movement of their movable portion 111a, 111b in two opposite directions). Alternatively or complementarily, at least one, and possibly each, electromechanical transducer 11a, 11b may be a (non-ferroelectric) piezoelectric transducer based on a material adapted to enable its movable portion 111a, 111b to move in opposite directions with respect to its balance position, as a function of the polarity of its electric power supply. For example, such a material is a material based on aluminium nitride (AlN).

Alternatively, or complementarily, each electromechanical transducer 11a, 11b may be or comprise a thermal transducer.

The first deformable diaphragm 12a, where appropriate as well as the second deformable diaphragm 12b that we introduce hereinbelow, may be based on a polymer, and is preferably based on PDMS. The properties of the first deformable diaphragm 12a, and also of the second one, in particular their thickness, their surface area and their shape may be configured so as to confer on the deformable diaphragm 12a, 12b, and more particularly on an area 121a, 121b of this diaphragm which is freely deformable, a targeted stretch capacity, in particular according to the targeted application.

As illustrated in particular in FIGS. 1A to 1C, the cavity 13 has more particularly walls 131, 132, 133 hermetically containing the deformable medium 14. In the illustrated examples, the wall 132 of the cavity 13 forms the rear face FAR of the electromechanical microsystem 1. The wall 131 opposite to the wall 132 is formed at least partially by at least one portion of the first deformable diaphragm 12a. Thus, the wall 131 is deformable. Next, the wall 131 is sometimes referred to as the first wall. It is located at the front face FAB of the electromechanical microsystem 1. At least one lateral portion 133 joins the walls 131 and 132 together. Where appropriate, the wall 132 opposite to the wall 131 is formed at least partially by a second deformable diaphragm 12b. It should be noted that the hermeticity of the cavity 13 requires each deformable diaphragm 12a, 12b being itself watertight, or made watertight, in particular at its free area 121a, 121b.

In turn, the deformable medium 14 could keep a substantially constant volume under the action of a change in the external pressure. In other words, it may consist of an incompressible or barely compressible medium the deformation of which preferably requires little energy. For example, it consists of a liquid.

Since at least one portion of the wall 131 of the cavity 13 is formed by the first deformable diaphragm 12a, it should be understood that any change in the external pressure exerted on the deformable medium 14 could be compensated by a substantially proportional deformation of the first deformable diaphragm 12a, and more particularly of its free area 121a and/or by a displacement of the movable portion 111a, 111b of at least one of the two electromechanical transducers 11a, 11b. When at least one of the two transducers 11a, 11b is loaded, this compensation is more particularly related to a conversion of the change in the external pressure exerted on the deformable medium 14 into a stretching of the first deformable diaphragm 12a or a relaxation of the already stretched first deformable diaphragm 12a. The same applies, where appropriate, to the second deformable diaphragm 12b.

It should be understood that, for reasons relating to the repeatability of the actuation or of the detection of the movement allowed by the electromechanical microsystem 1 according to the invention, it is preferably that any deformation of the first deformable diaphragm 12a is elastic, and not plastic, in order to guarantee the return of the first deformable diaphragm 12a to the same minimum stretch or maximum relaxation state, once it is no longer stressed. Again, the same applies, where appropriate, to the second deformable diaphragm 12b.

More particularly, the deformable medium 14 may comprise at least one amongst a fluid and/or a liquid. The parameters of the deformable medium will be adapted according to the targeted applications. Thus, it is ensured that any change in the external pressure exerted on the deformable medium 14 induces a substantially proportional deformation of the free area 121a of the first deformable diaphragm 12a and, where appropriate, of the free area 121b of the second deformable diaphragm 12b.

The deformable medium 14 may consist of or be based on a liquid, such as oil, or consist of or be based on a polymer. According to one example, the deformable medium is based on or consists of glycerine. Thus, in addition to a substantially proportional deformation of each diaphragm 12a, 12b, the capability of the deformable medium 14 to occupy in particular the volume created by stretching of the free area 121a, 121b of the deformable diaphragm 12a, 12b opposite to the centre of the cavity 13 is ensured.

It should be understood from the foregoing that the electromechanical microsystem 1 is configured so that the movement of each electromechanical transducer 11a, 11b depends on the change in the external pressure exerted on the deformable medium 14, to achieve the actuator function of the electromechanical microsystem 1, and conversely, to achieve the sensor function of the electromechanical microsystem 1. More particularly, in the case where the electromechanical microsystem 1 serves as an actuator, at least one of the two electromechanical transducers 11a, 11b is loaded so as to exert a change in the external pressure on the deformable medium 14 and therefore induce the deformation of the first deformable diaphragm 12a, and, where appropriate, that of the second deformable diaphragm 12b.

In the case where the electromechanical microsystem 1 comprises a unique deformable diaphragm, for example the first deformable diaphragm 12a, and serves as a sensor, the deformation of the first deformable diaphragm 12a, exerts a change in the external pressure on the deformable medium 14 which could induce a displacement of the movable portion 111a, 111b of the electromechanical transducers 11a, 11b.

As illustrated in each of FIGS. 1A to 1C, the electromechanical microsystem 1 may be such that the free area 121a of the first deformable diaphragm 12a is configured to cooperate with an external member 2. In this manner, the deformation of the free area 121a induces, or is induced by, a movement of the external member 2. The same could apply to the free area 121b of the second diaphragm 12b.

Hence, it is through the free area 121a of the first diaphragm 12a and, where appropriate, through the free area 121b of the second diaphragm 12b, that the electromechanical microsystem 1 displaces an external member 2.

Thus, in the case where the electromechanical microsystem 1 serves as an actuator, the activation of one of the electromechanical transducers 11a, 11b deforms the first diaphragm 12a and, where appropriate, the second diaphragm 12b, which displaces the member 2, and possibly each member 2 arranged together with one of the free areas 121a and 121b.

Conversely, in the case where the electromechanical microsystem 1 serves as a sensor, a press of an external member 2 on the unique first diaphragm 12a or a pull on the first diaphragm 12a by an external member 2, deforms the diaphragm 12a, which displaces the movable portions of the electromechanical transducers 11a, 11 b then ultimately generates a signal which depends on this displacement.

More particularly, as illustrated in FIGS. 1A and 1C, the cooperation between the free area 121a of the first deformable diaphragm 12a and the external member 2 may be achieved through a pin 122a fastened on the free area 121a. Furthermore, as illustrated in FIG. 1B, the cooperation between the free area 121a, 121b of each deformable diaphragm 12a, 12b and each external member 2 may be achieved through a pin 122a, 122b fastened on the free area 121a, 121b, respectively.

As illustrated in FIGS. 1A and 1C, the pin 122a may be more particularly fastened at the centre of the free area 121a of the first deformable diaphragm 12a, or be more generally fastened symmetrically with respect to the extent of the free area 121a of the first deformable diaphragm 12a. In this manner, the pin 122a is displaced, through the elastic deformation of the free area 121a, in a controlled direction, substantially vertical, and is not, or is slightly, inclined with respect to the vertical during its displacements. Thus, the lateral stroke of the pin 122a is advantageously limited. The same applies to the free area 121b of the second diaphragm 12b and of the pin 122b fastened on the free area 121b.

Complementarily or alternatively, each external member 2 may be structured so as to comprise a guide through which the external member 2 is intended to cooperate with the pin 122a, 122b. This guide may also contribute in resisting an inclination of the pin 122a, 122b during its displacements. We will see later on that the limitations that are thus reached in terms of lateral stroke of the pin 122a, 122b could be reinforced even more by the presence of at least one lateral stop 15a, 15b extending from a portion of the wall 131, 132 around the free area 121a, 121b of the deformable diaphragm 12a, 12b.

Without limitation, a gluing or a magnetisation of the pin 122a, 122b on the external member 2 could allow securing the pin 122a, 122b and the external member 2 together. Preferably, the energy of adhesion of the pin 122a, 122b on the free area 121a, 121b of the deformable diaphragm 12a, 12b is higher than that of the pin 122a, 122b on the external member 2. We will see, when we will describe the methods for manufacturing the electromechanical microsystems 1 illustrated in FIGS. 2A and 2B, that the energy of adhesion of the pin 122a, 122b on the free area 121a, 121b could be obtained through technological steps that are ordinary in the microelectronics industry. Thus, since this adhesive energy could be estimated or measured, it is, for example, easy to obtain by gluing, for example using an ad hoc resin, or by magnetisation, an attachment that has a lower energy than the energy with which the pin 122a, 122b is secured to the deformable diaphragm 12a, 12b Hence, it should be understood that the attachment of the pin 122a, 122b with an external member 2 is thus greatly modular in terms of holding force. In particular, this modularity could allow making the attachment between the pin 122a, 122b and the external member 2 removable, for example in order to enable the same electromechanical microsystem 1 according to the invention to be successively arranged with several external members 2, and possibly several pluralities of external members 2, with each it would be secured, and then detached.

As illustrated in each of FIGS. 1A to 1C, the first electromechanical transducer 11a forms a portion of the first wall 131 of the cavity 13. Thus, the electromechanical transducer 11a and the first deformable diaphragm 12a are placed on the same side of the cavity 13.

As illustrated in each of FIGS. 1A to 1C, the first diaphragm 12a has an inner face 12i configured to be in contact with the deformable medium 1 and an outer face 12e. The inner face 12i forms at least one portion of the wall 131 of the cavity 13. The first electromechanical transducer 11a has an inner face 11i directed opposite, and preferably in contact with, the outer face 12e of the first diaphragm 12a. The first electromechanical transducer 11a also has an outer face 11e, opposite to the inner face 11i, and directed towards the outside of the electromechanical microsystem 1. Alternatively, it is possible to provide for one or several intermediate layer(s) being disposed between the outer face 12e of the diaphragm 12 and the inner face 11i of the first transducer 12a.

The electromechanical microsystem 1 is configured so that the movement of the movable portion 111a of the first electromechanical transducer 11a causes a displacement of the first diaphragm 12a and therefore of the first wall 131 which encloses the medium 14.

Notice that:
  the first electromechanical transducer 11a extends over the first deformable diaphragm 12a, either while defining the free area 121a of the first deformable diaphragm 12a as illustrated in FIG. 1C, or while extending in a solid area, for example circular, separate from the free area 121a of the first deformable diaphragm 12a as illustrated in FIGS. 1A and 1B, and
  the first deformable diaphragm 12a separates the first electromechanical transducer 11a from the deformable medium 14.

As illustrated in each of FIGS. 1A to 1C, the second electromechanical transducer 11b has an inner face 11i and an outer face 11e, opposite to the inner face 11i and directed towards the outside of the electromechanical microsystem 1.

As illustrated in FIG. 1B, the second diaphragm 12b has an inner face 12i configured to be in contact with the deformable medium 14 and an outer face 12e. The inner face 12*i* forms a portion of the wall 132 of the cavity 13 opposite to the first wall 131; in absolute terms, it could alternatively form a portion of the wall 133 of the cavity 13. The inner face 11*i* of the second electromechanical transducer 11*b* is directed opposite, and preferably in contact with, the outer face 12*e* of the second diaphragm 12*b*. Alternatively, it is possible to provide for one or several intermediate layer(s) being disposed between the outer face 12*e* of the second diaphragm 12*b* and the inner face 11*i* of the second electromechanical transducer 12*b*.

The electromechanical microsystem 1, according to its embodiment illustrated in FIG. 1B, is configured so that the movement of the movable portion 111*b* of the second electromechanical transducer 11*b* causes a displacement of the first diaphragm 12*a* and of the second diaphragm 12*b* and therefore of the walls 131 and 132 which enclose the medium 14.

Notice that, in FIG. 1B:

The second electromechanical transducer 11*b* extends over the second deformable diaphragm 12*b* while extending in a solid area, for example circular, separate from the free area 121*b* of the second deformable diaphragm 12*b*; it could alternatively extend over the second deformable diaphragm 12*b* around the free area 121*b* of the deformable diaphragm 12*b*, and thus define the latter, and The second deformable diaphragm 12*b* separates the second electromechanical transducer 11*b* from the deformable medium 14.

Furthermore, each electromechanical transducer 11*a*, 11*b* may advantageously be secured to the deformable diaphragm 12*a*, 12*b* over an area 123*a*, 123*b* over which it extends, so that any movement of the movable portion 111*a*, 111*b* of the electromechanical transducer 11*a*, 11*b* induces, in particular over this area 123*a*, 123*b*, a stretching or a relaxation of the deformable diaphragm 12*a*, 12*b*. Thus, when at least one of the electromechanical transducers 11*a*, 11*b* is loaded so as to move towards the outside of the cavity (as illustrated by the arrow in dotted line extending from the movable portion 111*a*, 111*b* of each electromechanical transducer 11*a*, 11*b*), a decrease in the external pressure exerted on the deformable medium 14 is observed, which induces the stretching of the first deformable diaphragm 12*a*, and where appropriate of the second deformable diaphragm 12*b*, towards the centre of the cavity 13.

Note herein that this attachment between each electromechanical transducer 11*a*, 11*b* and the deformable diaphragm 12*a*, 12*b* over which it extends is just merely preferable for the electromechanical microsystem 1, in particular to the extent that the movable portion 111*a*, 111*b* of each electromechanical transducer 11*a*, 11*b* may be intended to press on the deformable diaphragm 12*a*, 12*b* over which it extends when the electromechanical transducer 11*a*, 11*b* is loaded and/or to the extent that the deformable diaphragm 12*a*, 12*b* may naturally tend to remain in contact with the movable portion 111*a*, 111*b* of the electromechanical transducer 11*a*, 11*b* which extends over it when the latter des not press on the deformable diaphragm 12.

Referring to FIGS. 1A to 1C, a first cowl 18*a* may be provided which is configured, and which is more particularly rigid enough, to hold the first diaphragm 12*a* at least around its free area 121*a* and/or around the area 123*a* over which the first transducer 11*a* extends. Thus, the first diaphragm 12*a* is located between the first cowl 18*a* and the deformable medium 14. For example, this first cowl 18*a* primarily extends in the plane xy. It has at least one opening which defines the area 123*a*. It may further have an opening which defines the free area 121*a* (Cf. FIGS. 1A and 1B). The first cowl 18*a* may extend over the entire surface of the cavity 13, projected on the plane xy, except for at least one opening defining the opening 123*a* and/or the opening 121*a*. As illustrated in FIGS. 1A and 1B, the first cowl 18*a* may have an area that separates these two openings 123*a* and 121*a*.

Referring to FIGS. 1A to 1C, a second cowl 18*b* may be provided for which is:

configured to define, as illustrated in FIGS. 1A and 1C, at least one opening 123*b* over which the second transducer 11*b* extends, and configured, and more particularly rigid enough, to hold, as illustrated in FIG. 1B, the second diaphragm 12*b* at least around its free area 121*b*. Thus, the second diaphragm 12*b* is located between the second cowl 18*b* and the deformable medium 14.

For example, this second cowl 18*b* primarily extends in the plane xy. It has at least one opening which defines the area 123*b*. It may further have an opening that defines the free area 121*b* of the second diaphragm 12*b* (Cf. FIG. 1B). The second cowl 18*b* may extend over the entire surface of the cavity 13, projected on the plane xy, except for at least one opening defining the opening 123*b* and, where appropriate, the opening 121*b*. As illustrated in FIG. 1B, the second cowl may have an area that separates these two openings 123*b* and 121*b*.

FIG. 1A schematically illustrates a first embodiment of the microsystem 1 according to the invention. This embodiment may comprise a unique deformable diaphragm called first deformable diaphragm and bearing the reference 12*a*. It further comprises the two electromechanical transducers 11*a* and 11*b*.

The two transducers 11*a* and 11*b* may be configured so that loading thereof or a decrease in the external pressure subjected to the deformable medium 14 induces movement thereof towards the inside of the cavity 13, as illustrated by the arrows in solid line in FIG. 1A.

Alternatively, the two transducers 11*a* and 11*b* are configured so that loading thereof or an increase in the external pressure subjected to the deformable medium 14 induces movement thereof towards the outside of the cavity 13, as illustrated by the arrows in dashed line in FIG. 1A.

Each of the two transducers 11*a* and 11*b* may be in the form of a disk with a radius R, for example equal to 200 microns. Other shapes could also be considered. Furthermore, the two transducers 11*a* and 11*b* may have different dimensions;

The first transducer 11*a* forms a portion of the first wall 131 of the cavity 13. It should be recalled that this first wall 131 is at least partially formed by the first diaphragm 12*a*. Notice that the free area 121*a* of the first diaphragm 12*a* is offset with respect to the first transducer 11*a*. More particularly, the first transducer 11*a* extends in a solid area, for example circular, separate from the free area 121*a* of the first deformable diaphragm 12*a*.

As illustrated by the arrows in solid and dashed lines, the two transducers 11*a* and 11*b* are preferably configured to move in the same direction with respect to the centre of the cavity 13.

The second transducer 11*b* forms a portion of the wall 132 opposite to the first wall 131 of the cavity 13. Alternatively, the second transducer 11*b* may form a portion of the wall 133 joining the walls 131 and 132 if the cavity 13 together.

More particularly, in FIG. 1A, the second transducer 11*b* may be located opposite the first transducer 11*a*. Alternatively, the second transducer 12b may be located opposite the free area 121a of the first deformable diaphragm 12a.

When one of the two transducers 11a and 11b is loaded, it causes a deformation of the free area 121a of the first diaphragm 12a which induces the displacement of the external member 2. When the other one of the two transducers 11a and 11b is also loaded, it causes an increased deformation of the free area 121a of the first diaphragm 12a which substantially induces a duplication of the displacement of the external member 2.

For example, the surface of the free area 121a of the first diaphragm 12a is smaller, and more particularly twice as smaller, and possibly ten times smaller, than the surface over which each of the two transducers 11a and 11 b extends.

FIG. 1B illustrates a second embodiment of the microsystem 1 according to the invention. This embodiment comprises the aforementioned two deformable diaphragms 12a and 12b. A comparison of the embodiments illustrated in FIGS. 1A and 1B shows that their upper portions, located above a plane perpendicular to the axis z and passing through the centre of the cavity 13, are identical. As regards the upper portion of FIG. 1B, reference is made to the description of FIG. 1A.

Furthermore, it is observed in FIG. 1B that the lower portion of this figure is symmetrical to its upper portion through a 180° rotation around the centre of the cavity 13. Alternatively, a symmetry with respect to a plane perpendicular to the axis z and passing through the centre of the cavity 13 between the lower and upper portions may be considered.

When one of the two transducers 11a and 11b is loaded, it causes a deformation of each the free areas 121a and 121b of the first and second diaphragms 12a and 12b which induces the displacement of each of the external members 2 located on either side of the electromechanical microsystem 1. When the other one of the two transducers 11a and 11b is also loaded, it causes an increased deformation of the free areas 121a and 121b of the first and second diaphragms 12a and 12b which substantially induces a duplication of the displacement of the external members 2.

The external members 2 may be joined together so as to form a fixed or hinged structure. Henceforth, it should be understood that the microsystem 1 according to the second embodiment of the invention could enable gripping of such a structure and/or exerting on such a structure a spreading or pushing force (in particular in the case of symmetry between the upper and lower portions of the microsystem 1 with respect to a plane perpendicular to the axis z and passing through the centre of the cavity 13).

For example, the surface of each free area 121a, 121b of the first and second diaphragms 12a, 12b is at least twice as small, and more particularly four times smaller, and possibly ten times smaller, than the surface over which each of the two transducers 11a and 11b extends.

Also note that the free areas 121a and 121b of the first and second diaphragms 12a, 12b may have shapes and/or dimensions different from each other.

FIG. 1C illustrates a third embodiment of the microsystem 1 according to the invention. This embodiment comprises a first deformable diaphragm 12a whose free area 121a is centred with respect to the first transducer 11a. More particularly, the second transducer 11b is located opposite the first transducer 11a, so that the microsystem 1 could feature an axisymmetry, and possibly a rotational symmetry, around an axis directed according to the axis z and passing through the centre of the cavity 13, or a symmetry with respect to a plane perpendicular to the axis y passing through the centre of the cavity.

When one of the two transducers 11a and 11b is loaded, it causes a deformation of the free area 121a of the first diaphragm 12a which induces the displacement of the external member 2. When the other one of the two transducers 11a and 11b is also loaded, it causes an increased deformation of the free area 121a of the first diaphragm 12a which substantially induces a duplication of the displacement of the external member 2.

Alternatively to the embodiment illustrated in FIG. 1C, a possible embodiment considers a microsystem 1 whose upper portion would be identical to that illustrated in FIG. 1C and whose lower portion would be obtained by symmetry of this upper portion with respect to a plane perpendicular to the axis z and passing through the centre of the cavity 13. Thus, such an embodiment would comprise two deformable diaphragms and two electromechanical transducers each surrounding a free area of a respective one of the two deformable diaphragms. Such an embodiment would potentially enable the displacement of two external members 2.

Note that the embodiment illustrated in FIG. 1C offers the same advantages as that one illustrated in FIG. 1A, and is advantageously more compact.

FIG. 1C illustrates the partial overlap of the first deformable diaphragm 12a by the first electromechanical transducer 11a. The first electromechanical transducer 11a may be in the form of a ring with a radial extent denoted R2 and defines a circular free area 121a with a radius denoted R1.

Note that the first electromechanical transducer 11a could be not limited to an annular shape, but could have other shapes, and in particular an oblong or oval shape, a triangular, rectangular shape, etc., defining a corresponding plurality of shapes of the free area 121a of the first deformable diaphragm 12a.

This description of FIG. 1C applies in particular for a rotational symmetry or axisymmetry. Nevertheless, FIG. 1C could also be viewed as illustrating a structure symmetrical with respect to a perpendicular plane and centred with respect to the surface of the free area 121a; such a structure would consist in particular of three strips, adjacent in pairs, where the central strip would represent the free area 121a of the first deformable diaphragm 12a and whose lateral strips would represent the movable portion of the involved first electromechanical transducer(s) 11a.

In particular when the partial overlap of the first deformable diaphragm 12a by the first electromechanical transducer 11a is as illustrated in FIGS. 1A to 1C and the first electromechanical transducer 11a is a piezoelectric transducer comprising a PZT-based piezoelectric material, it is interesting that the movable portion 111a of the electromechanical transducer 11a has a surface at least twice as large, possibly at least four times larger, and preferably at least ten times larger than the surface of the free area 121a of the first deformable diaphragm 12a. Henceforth, the first deformable diaphragm 12a may be configured so that its free area 121a could be deformed with an amplitude of at least 50 µm, of about 100 µm, and possibly of several hundred microns, under loading of one of the two transducers 11a and 11b, or alternatively under loading of the two transducers 11a and 11b.

In general, the first deformable diaphragm 12a is preferably configured so that its free area 121a could be deformed with an amplitude lower than 1 mm.

The deformation amplitude of each free area 121a, 121b is measured according to a direction perpendicular to the plane in which the outer face 12e of the first diaphragm 12a and, where appropriate, of the second diaphragm 12b, primarily extends at rest.

Without tearing and/or without any significant wear, the electromechanical microsystem 1 allows for a hydraulic amplification of the action and thus offers the capability to address numerous and various applications requiring a large stroke. In this context, the electromechanical microsystem 1 illustrated in FIGS. 1A to 1C may be defined as an actuator with a large ascending or descending stroke.

Also when the partial overlap of the first deformable diaphragm 12a by the first electromechanical transducer 11a is as illustrated in FIGS. 1A and 1B and the first electromechanical transducer 11a is a piezoelectric transducer comprising a PZT-based piezoelectric material, the radius R1 of the free area 121a of the first deformable diaphragm 12a may be substantially equal to 100 µm and the radius R2 of the first electromechanical transducer 11a may be substantially equal to 350 µm.

When the partial overlap of the first deformable diaphragm 12 by the first electromechanical transducer 11a is as illustrated in FIGS. 1A and 1B and the first electromechanical transducer 11a is a piezoelectric transducer comprising a PZT-based piezoelectric material, but with reference to FIGS. 2A and 2B discussed in more details hereinbelow, the first electromechanical transducer 11a comprises, more particularly, an element forming a beam 305a and a PZT-based piezoelectric element 302a. The thickness of the piezoelectric element 302a may be substantially equal to 0.5 µm and the thickness of the beam 305a is comprised for example between a few microns and several tens microns, for example 5 µm. In such a configuration, the movable portion 111a of the first electromechanical transducer 11a could be displaced or deflected with an amplitude substantially equal to 15 µm when crossed by an electric voltage equal to a few tens volts.

Nonetheless, the invention is not limited to the different specific values given hereinabove which could be substantially adapted, depending on the targeted application, in particular to find a trade-off between the stretch factor and the expected amplitude of deformation of the free area 121 of the deformable diaphragm 12.

It should be noted that, in its balance position, the movable portion 111a of the first electromechanical transducer 11a, and more generally the first electromechanical transducer 11a, could be not flat, but could, on the contrary, feature a so-called balance deflection, which does not deprive the electrically-powered first electromechanical transducer 11a in any manner from its capability to move or deflect, in terms of amplitude.

Note that, in particular when at least one of the two electromechanical transducers 11a and 11b is a piezoelectric transducer, it may advantageously be a transducer with a vibratory operation. Its resonance frequency is then preferably lower than 100 kHz, and even more preferably lower than 1 kHz. The vibratory dynamics thus obtained could allow reaching larger strokes than is the case in static operation, in particular by exploiting the related resonance phenomenon or reducing the consumption of the electromechanical microsystem for a given stroke. It should be understood that, depending on the degree of symmetry of the embodiments described and considered hereinabove with reference to FIGS. 1A to 1C, various vibratory dynamics could be obtained for a corresponding variety of applications.

As already mentioned hereinabove, the electromechanical microsystem 1 may further comprise one or several lateral stop(s) 15 supported by the first wall 131 of the cavity 13 and/or the wall 132 opposite to the first wall 131 of the cavity 13. More particularly, each lateral stop 15 extends opposite to the cavity 13. For example, a lateral stop 15 may contribute in clamping the non-movable portion of a transducer, to better ensure the non-movability thereof; it then extends from the non-movable portion of the transducer 11a, 11b and/or at a distance from its movable portion 111a, 111b, and then coincides with the cowl 18a, 18b filling this same function.

Thus, like the cowl 18a, 18b, a lateral stop 15 may have an action of holding a non-movable portion of an electromechanical transducer 11a, 11b in position, said non-movable portion being complementary to the movable portion 111a, 111b of the electromechanical transducer 11a, 11b. In this respect, each lateral stop 15 coincides with one of the cowls 18a and 18b. For example, as illustrated in FIG. 2A, the action of holding the non-movable portion of the first electromechanical transducer 11a may be more particularly ensured by clamping thereof by a lateral stop 15 and/or the cowl 18a located at the periphery of the area 123a over which the first electromechanical transducer 11a extends and the action of holding the non-movable portion of the second electromechanical transducer 11b may be more particularly ensured by clamping thereof by a lateral stop 15 and/or the cowl 18b at the periphery of the area 123b over which the second electromechanical transducer 11b extends. Furthermore, in order to improve holding provided by such lateral stops 15 and/or such cowls 18a and 18b, each spacer, as described hereinbelow, preferably extends towards the central portion of the microsystem 1 at least up to opposite the first lateral stop and/or the cowl, so as to participate in holding the non-movable portion of an electromechanical transducer.

The pin 122 may extend, opposite to the cavity 13, beyond or short within the lateral stops 15.

The lateral stops 15a, 15b are primarily configured to enable guidance and self-positioning of the external member 2 on the electromechanical microsystem 1. It also contributes in limiting, and possibly suppressing, the risk of pull-out of the deformable diaphragm 12a, 12b when affixing the external member 2 on the electromechanical microsystem 1. Note herein that, depending on the extent of the external member 2, the lateral stops 15a, 15b may also serve as a top stop limiting the approach of the external member 2 to the electromechanical microsystem 1. This particularity may also allow inducing a detachment of the pin 122a, 122b and of the external member 2 from each other by pulling the pin 122a, 122b in a position lower than that possibly reached by the external member 2 as the latter abuts on the top of the lateral stops 15a, 15b. More specifically, the lateral stops 15a, 15b have a stop surface configured to stop the displacement of the member 2. The electromechanical microsystem 1 is configured so that when the displacement of the member 2 is stopped in its displacement, according to a given direction, by the lateral stops 15a, 15b, the pin 122a, 122b could carry on its displacement, in this same direction. Thus, the pin 122a, 122b is detached from the member 2.

Figure 2A:
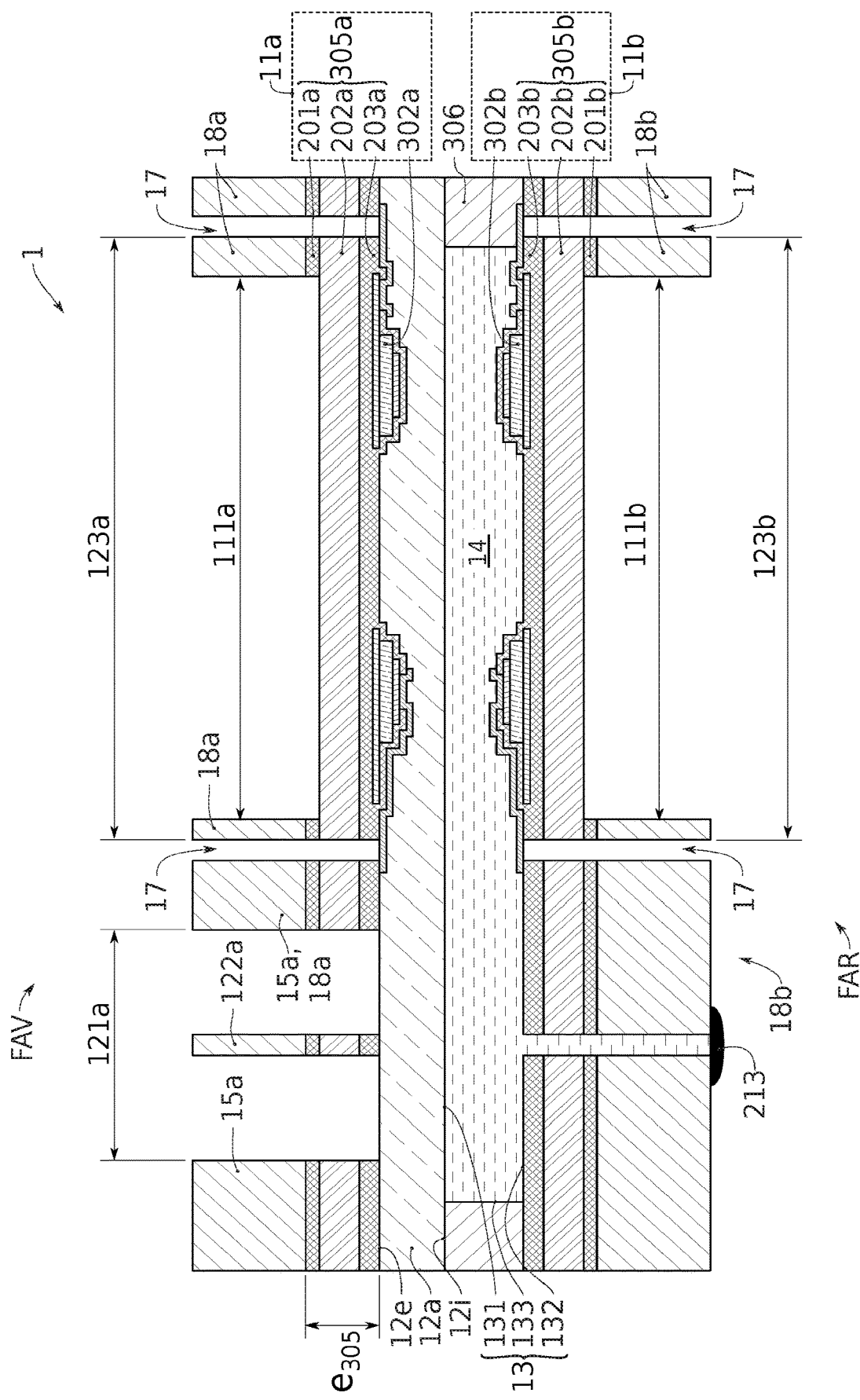
FIG. 2A schematically represents a sectional view or a section of an electromechanical microsystem according to the first embodiment of the invention.
Figure 2B:
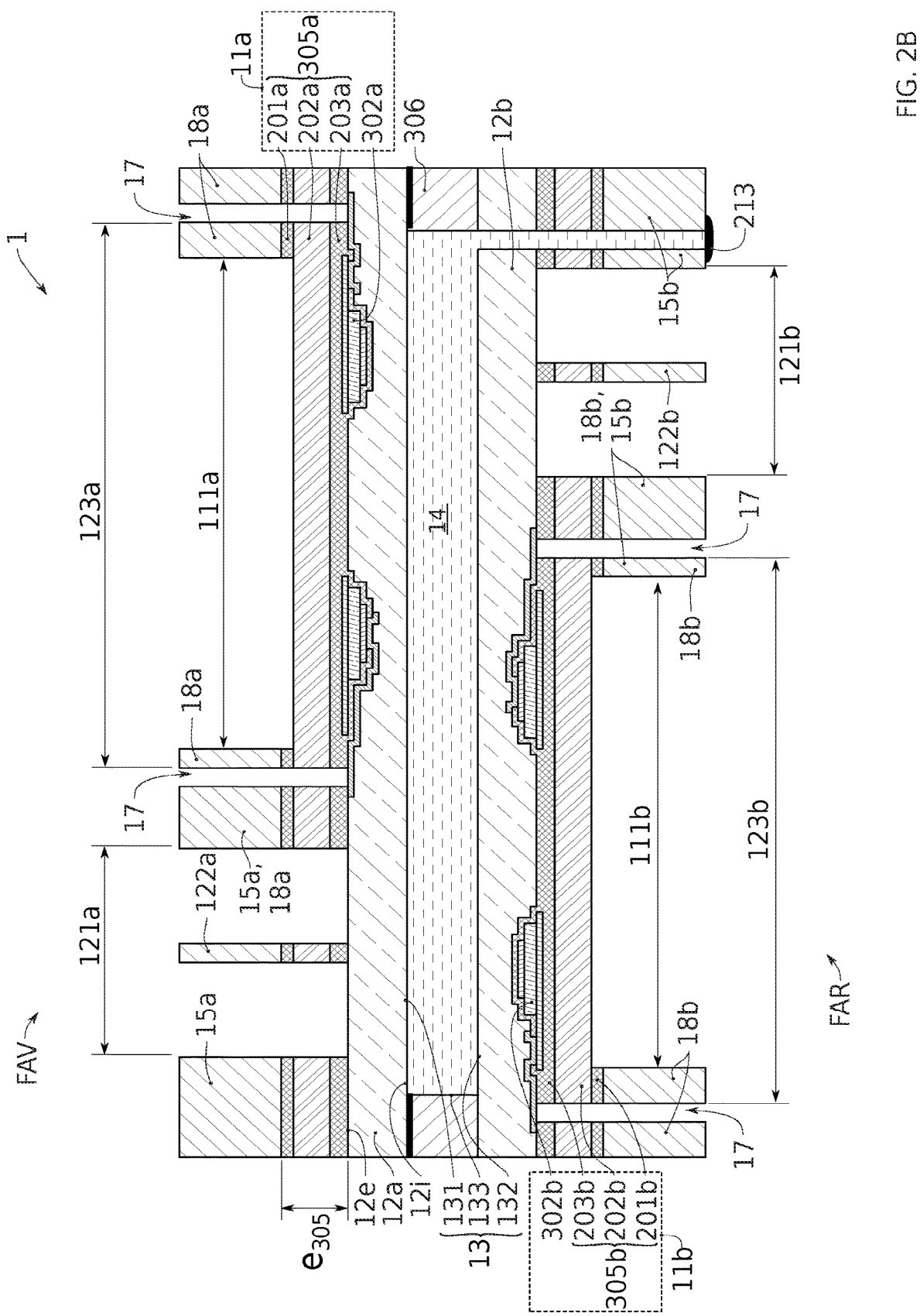
FIG. 2B schematically represents a sectional view or a section of an electromechanical microsystem according to the second embodiment of the invention.

Embodiments of the invention that are more specific than those described hereinabove are illustrated in FIGS. 2A and 2B wherein the same references as in FIGS. 1A and 1B refer to the same objects.

First of all, it is observed therein that each illustrated electromechanical transducer 11a, 11b comprises a beam 305a, 305b, and a piezoelectric material 302a, 302b configured to deform the beam 305a, 305b when it is subjected to an electric voltage.

It should be noticed, in FIGS. 2A and 2B, that the piezoelectric material 302a, 302b of each transducer 11a, 11b is located towards the inside of the cavity 13, whereas the beam 305a, 305b of each transducer 11a, 11b is located towards the outside of the cavity 13. It is this feature that allows obtaining antagonist deformations of the beams 305a, 305b. It is in this manner that the deformation of one of the two beams 305a, 305b induces the same effect, herein an increase in the external pressure on the deformable medium 14, as the deformation of the other one of the two beams.

The specific embodiments illustrated in FIGS. 2A and 2B correspond more particularly to the embodiments illustrated in FIGS. 1A and 1B whose deformations are represented by arrows in solid line.

As indicated in FIG. 1A by the arrows in dashed lines, it could also be considered that the transducers 11a, 11b are configured so as to be deformed in directions opposite with regards to the specific embodiments illustrated in FIGS. 2A and 2B. In which case, the piezoelectric material 302a, 302b of each transducer 11a, 11b would be located towards the outside of the cavity 13, whereas the beam 305a, 305b of each transducer 11a, 11 b would be located towards the inside of the cavity 13.

In light of the description hereinbelow of the method for manufacturing the microsystems 1 as illustrated in FIGS. 2A and 2B, it will clearly appear that both of the above-described arrangements of the piezoelectric materials 302a and 302b with respect to the beams 305a and 305b, and more generally with respect to the neutral fibres of the electromechanical transducers 11a and 11b, could be easily obtained through deposition and etching steps which could be considered as ordinary in the microelectronics industry.

It should also be noticed that, if each of the two transducers 11a and 11 b could be in the form of a disk with a radius R, each piezoelectric material 302a, 302b could be in the form of a ring. For example, the radial extent of the ring formed by each piezoelectric material 302a, 302b is comprised between 10 and 1,000 microns, and typically substantially equal to 200 microns. Alternatively, and as mentioned hereinabove, it is also possible to consider the piezoelectric materials 302a and 302b forming strips extending perpendicularly to the plane yz as illustrated for example in FIG. 1A.

More particularly, in FIGS. 2A and 2B, the piezoelectric material 302a of the first transducer 11a is located under the beam 305a, i.e. it is located between the beam 305a and the first diaphragm 12a. When an electric voltage is applied to the piezoelectric material 302a, it retracts and displaces with it the portion of the beam 305a located at the centre of the ring formed by the piezoelectric material 302a. This portion of the beam 305a beam bends downwards, displacing with it at least one portion of the area 123a of the first diaphragm 12a connected to the beam 305a. In turn, by volume conservation, the free area 121a of the first diaphragm 12a and, where appropriate, the free area 121b of the second diaphragm 12b, are displaced opposite to the centre of the cavity 13, thereby causing the displacement of the pin 122a and, where appropriate, of the pin 122b, opposite to the centre of the cavity 13.

In FIGS. 2A and 2B, the piezoelectric material 302b of the second transducer 11b is located above the beam 305b. When an electric voltage is applied to the piezoelectric material 302b, it retracts and displaces with it the portion of the beam 305b located at the centre of the ring formed by the piezoelectric material 302b. This portion of the beam 305b beam bends upwards, and more particularly towards the centre of the cavity, displacing with it at least one portion of the area 123b of the second diaphragm 12b connected to the beam 305b. In turn, by volume conservation, the free area 121a of the first diaphragm 12a and, where appropriate, the free area 121b of the second diaphragm 12b, are displaced opposite to the centre of the cavity 13, thereby causing the displacement of the pin 122a and, where appropriate, of the pin 122b, opposite to the centre of the cavity 13.

In FIGS. 2A and 2B, access openings for an electrical connection of the electrodes could also be observed. In these examples, these openings form vias 17. In this example, the vias 17 cross the entire thickness of one of the beams 305a and 305b.

The thickness e305 of each beam 305a, 305b is measured according to a direction perpendicular to the plane in which the faces 12e and 12i of each diaphragm 12a, 12b primarily extend. The thickness e305 is referenced in FIGS. 2A and 2B.

The beams 305a and 305b illustrated in FIGS. 2A and 2B have substantially the same thickness e305, but could alternatively have different thicknesses. Thus, an asymmetry between the actuations provided by the transducers 12a and 12b is obtained, which might be desirable for some applications.

More particularly, FIGS. 2A and 2B illustrate embodiments of the invention which have been obtained through deposition and etching steps which could be considered as ordinary in the microelectronics industry. More particularly, the electromechanical microsystem 1 according to the embodiment illustrated in FIG. 2A has been obtained through the succession of steps illustrated by FIGS. 3 to 6, 7A, 8A, 9A and 10A and the electromechanical microsystem 1 according to the embodiment illustrated in FIG. 2B has been obtained through the succession of steps illustrated by FIGS. 3 to 6, 7B, 8B, 9B and 10B. Thus, two manufacturing methods are illustrated each leading to one of the electromechanical microsystems 1 illustrated in FIGS. 2A and 2B.

At least one common feature of these manufacturing methods is that they comprise:
- a step of forming, over a first substrate 200a, what is intended to form at least one portion of the first electromechanical transducer 11a and the first deformable diaphragm 12a, and
- a step of forming, over a second substrate 200b, what is intended to form at least one portion of the second electromechanical transducer 11b, then
- a step of forming an open cavity 13 over the first deformable diaphragm 12a by affixing the second substrate 200b over the first substrate 200a, then
- a step of filling with the deformable medium 14 and closing the cavity 13, and
- a step of etching the first and second substrates 200a and 200b to form, respectively, the front face and the rear face of the electromechanical microsystems illustrated in FIGS. 2A and 2B.

We successively describe each of the aforementioned manufacturing methods hereinbelow, starting with the method for manufacturing the electromechanical microsystem 1 as illustrated in FIG. 2A.

Figure 3:
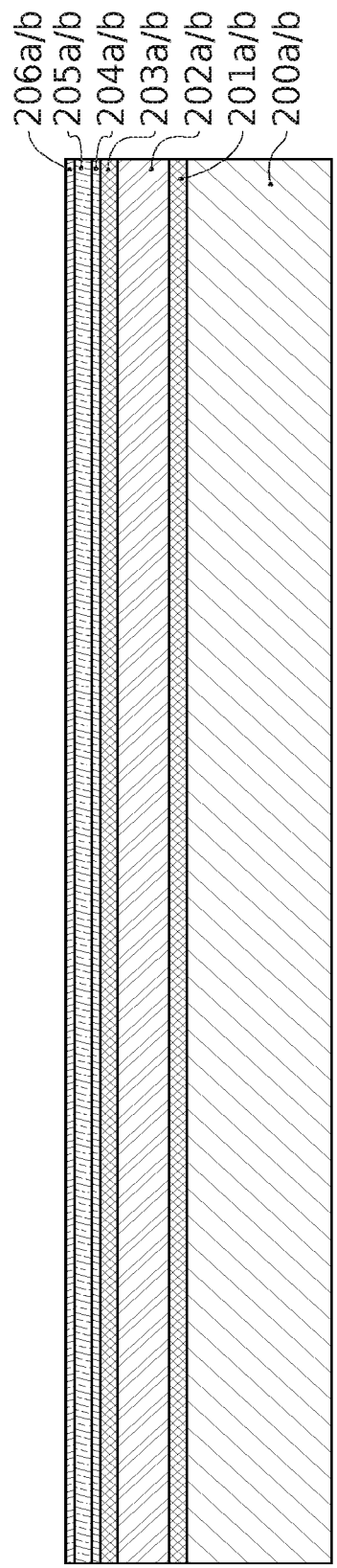
FIGS. 3 to 6 schematically represent a sectional view or a section of the electromechanical microsystem according to the first and second embodiments of the invention at different steps of the beginning of their manufacturing process.

The first step of this method is illustrated in FIG. 3. It consists in providing a first substrate 200a over which extends a stack of layers which may successively comprise, starting from one face of the first substrate 200a:
- a first insulating layer 201a, for example based on silicon oxide, which may be deposited by Plasma-Enhanced Chemical Vapour Deposition (or PECVD), a layer 202a intended to form the beam 305a of the first electromechanical transducer 11a, this layer 202a being for example based on amorphous silicon and may be deposited by Chemical Vapour Deposition (or CVD) at subatmospheric pressure (or LPCVD), a second insulating layer 203a, for example based on silicon oxide and which may be deposited by PECVD, a layer 204a intended to form a so-called lower electrode, for example based on platinum and which may be deposited by Physical Vapour Deposition (or PVD), a layer 205a made of a piezoelectric material, for example based on PZT, and which may be deposited through sol-gel process, and a layer 206a intended to form a so-called upper electrode, for example based on platinum and which may be deposited by PVD.

Figure 4:
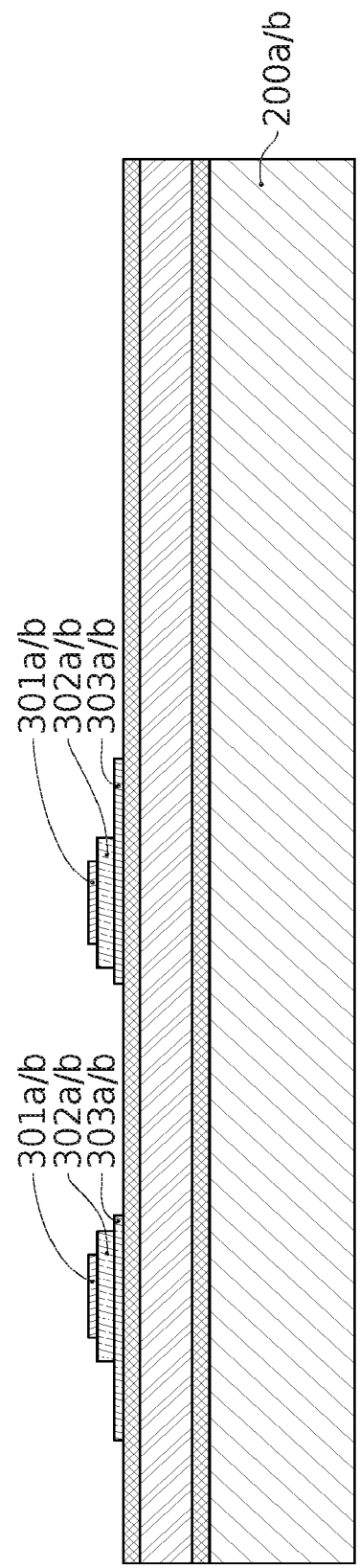

The second step of the method for manufacturing the electromechanical microsystem 1 as illustrated in FIG. 2A is illustrated in FIG. 4. It comprises:

etching of the layer 206a so as to form the upper electrode 301a of the first electromechanical transducer 11a, etching of the layer 205a so as to form the piezoelectric elements 302a of the first electromechanical transducer 11a, and etching of the layer 204a so as to form the lower electrode 303a of the first electromechanical transducer 11a.

Note that each of these etchings may be carried out by lithography, and preferably by plasma etching, or by a wet chemical process.

Figure 5:
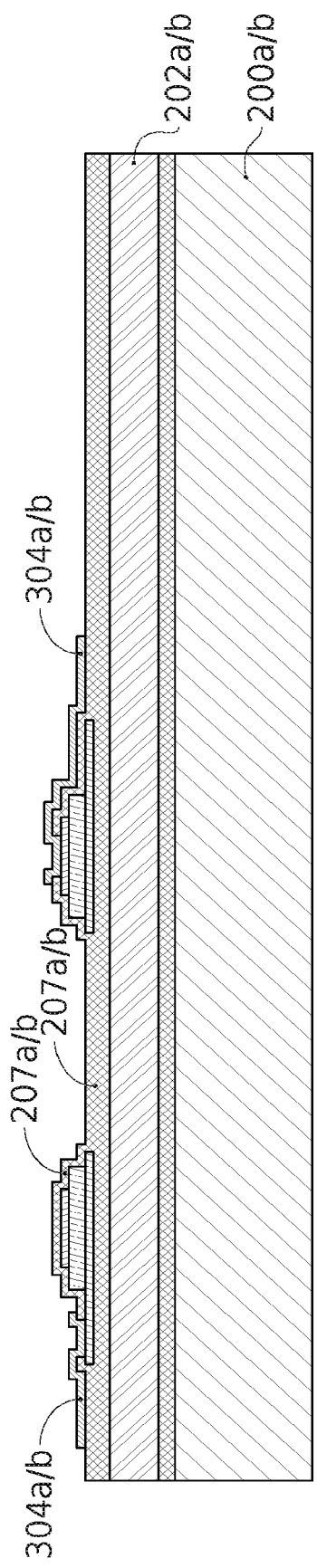

The third step of the method for manufacturing the electromechanical microsystem 1 as illustrated in FIG. 2A is illustrated in FIG. 5. It comprises:

the deposition of a passivation layer 207a, for example based on silicon oxide and/or silicon nitride, may be deposited by PECVD, opening, through the passivation layer 207a, of an area for resuming contact per electrode, this opening may be carried out for example by lithography, and preferably by plasma etching, or by a wet chemical process, the deposition of a layer intended to form an electric line 304a per electrode, the layer being for example based on gold and may be deposited by PVD, and etching of the previously deposited layer so as to form an electric line 304a per electrode, this etching being carried out for example by lithography, and preferably by plasma etching, or by a wet chemical process.

Figure 6:
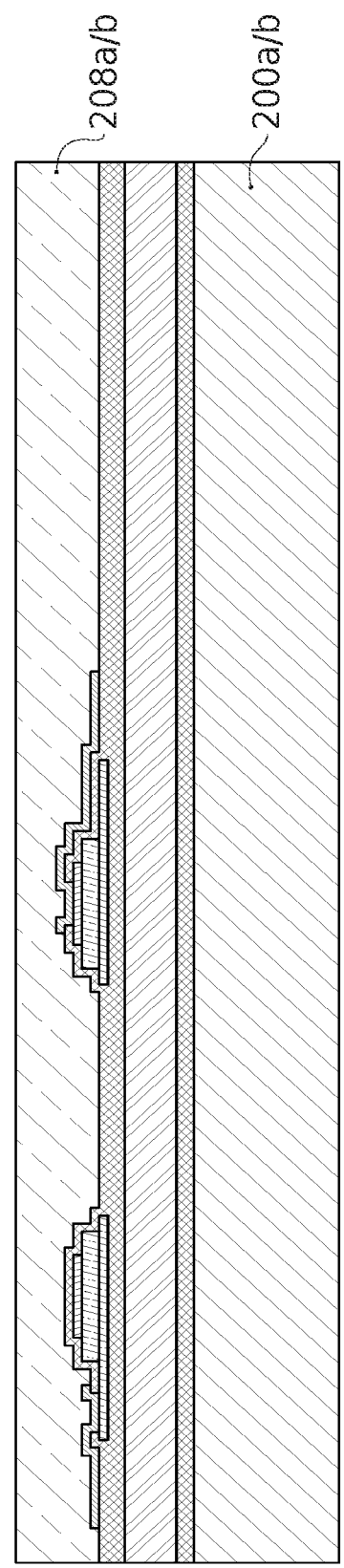

The fourth step of the method for manufacturing the electromechanical microsystem 1 as illustrated in FIG. 2A is illustrated in FIG. 6. It comprises the deposition of a polymer-based layer 208a intended to form the first deformable diaphragm 12a. For example, this layer 208a is deposited by spin coating. For example, the polymer based on which the layer 208a is formed is based on PDMS.

The fifth step of the method for manufacturing the electromechanical microsystem 1 as illustrated in FIG. 2A is illustrated in FIG. 7A. It comprises the formation of at least one spacer 306 intended to form at least one portion of the lateral wall 133 of the cavity 13. The formation of the spacer(s) may comprise rolling of a photosensitive material based on which the spacer(s) is/are formed, insulation, and then the development of the photosensitive material. Said photosensitive material may be based on a polymer, and in particular based on Siloxane. Rolling of the photosensitive material may comprise rolling of a dry film of said material.

Figure 8A:
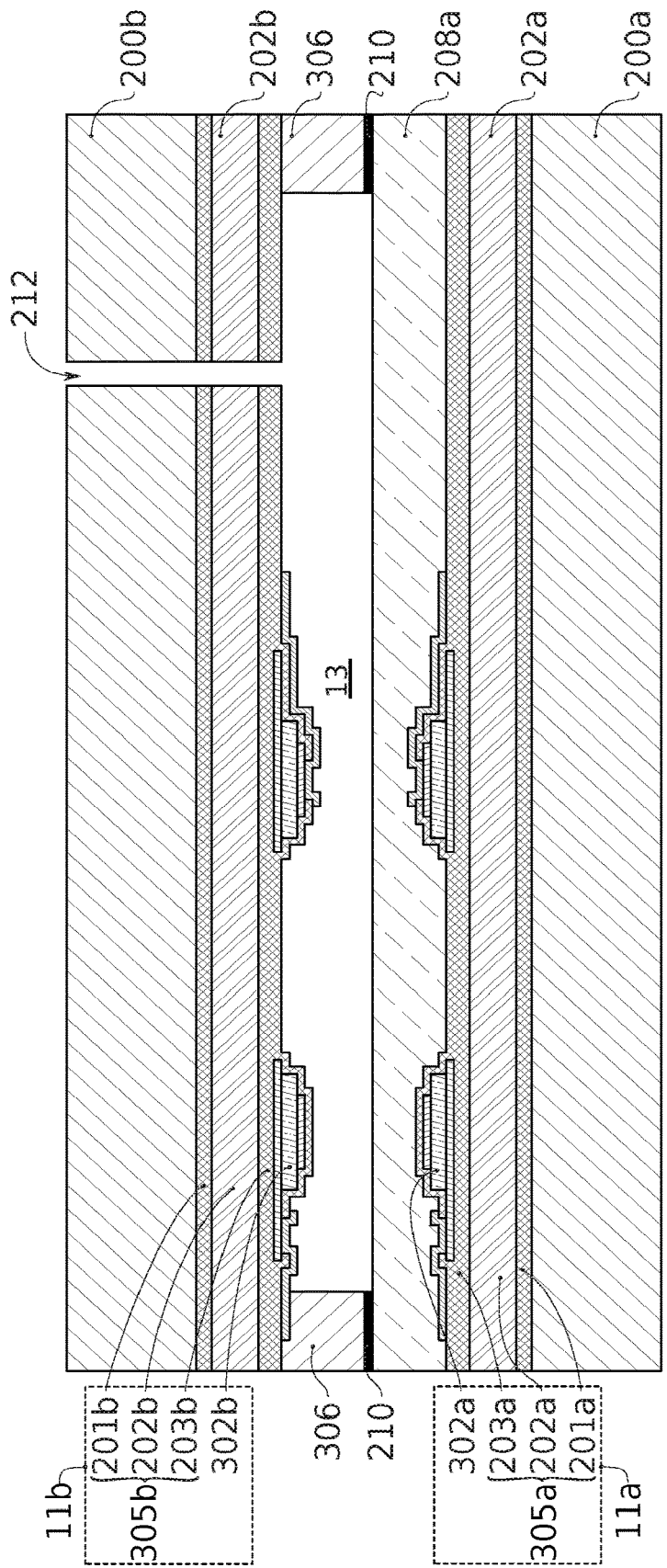

The sixth step of the method for manufacturing the electromechanical microsystem 1 as illustrated in FIG. 2A is illustrated in FIG. 8A. According to an optional embodiment, this step comprises the deposition of glue 210 at the top of each spacer 306, this deposition could be carried by screen-printing or by dispensing. It comprises fastening, for example by gluing, at the top of the spacer(s) (possibly through the glue 210), a portion of the second electromechanical transducer 11b on a second substrate 200b. The latter may be structured so as to comprise at least one through vent 212. In an alternative embodiment, depending on the nature of the spacer, the latter could serve as glue. Upon completion of this sixth step, the cavity 13 is formed which is open by at least one through vent 212.

More particularly, said portion of the second electromechanical transducer 11b could have been obtained through a deposition of a stack of layers extending over the second substrate 200b, and more particularly over its face intended to be affixed opposite the first substrate 200a. This stack of layers may successively comprise:

a first insulating layer 201b, for example based on silicon oxide, which may be deposited by Plasma-Enhanced Chemical Vapour Deposition (or PECVD), a layer 202b intended to form the beam 305b of the second electromechanical transducer 11b, this layer 202b being for example based on amorphous silicon and may be deposited by Chemical Vapour Deposition (or CVD) at subatmospheric pressure (or LPCVD), a second insulating layer 203b, for example based on silicon oxide and which may be deposited by PECVD, a layer intended to form a so-called lower electrode, for example based on platinum and which may be deposited by Physical Vapour Deposition (or PVD), a layer made of a piezoelectric material, for example based on PZT, and which may be deposited through sol-gel process, and a layer intended to form a so-called upper electrode, for example based on platinum and which may be deposited by PVD, etching of the layer intended to form a so-called upper electrode so as to form the upper electrode 301b of the second electromechanical transducer 11b, etching of the layer made of a piezoelectric material so as to form the piezoelectric elements 302b of the second electromechanical transducer 11b, etching of the layer intended to form a so-called lower electrode so as to form the lower electrode 303b of the second electromechanical transducer 11b, the deposition of a passivation layer, for example based on silicon oxide and/or silicon nitride, may be deposited by PECVD, opening, through the passivation layer, of an area for resuming contact per electrode, this opening may be carried out for example by lithography, and preferably by plasma etching, or by a wet chemical process, the deposition of a layer intended to form an electric line 304b per electrode, the layer being for example based on gold and may be deposited by PVD, and etching of the previously deposited layer so as to form an electric line 304b per electrode, this etching being carried out for example by lithography, and preferably by plasma etching, or by a wet chemical process.

Figure 9A:
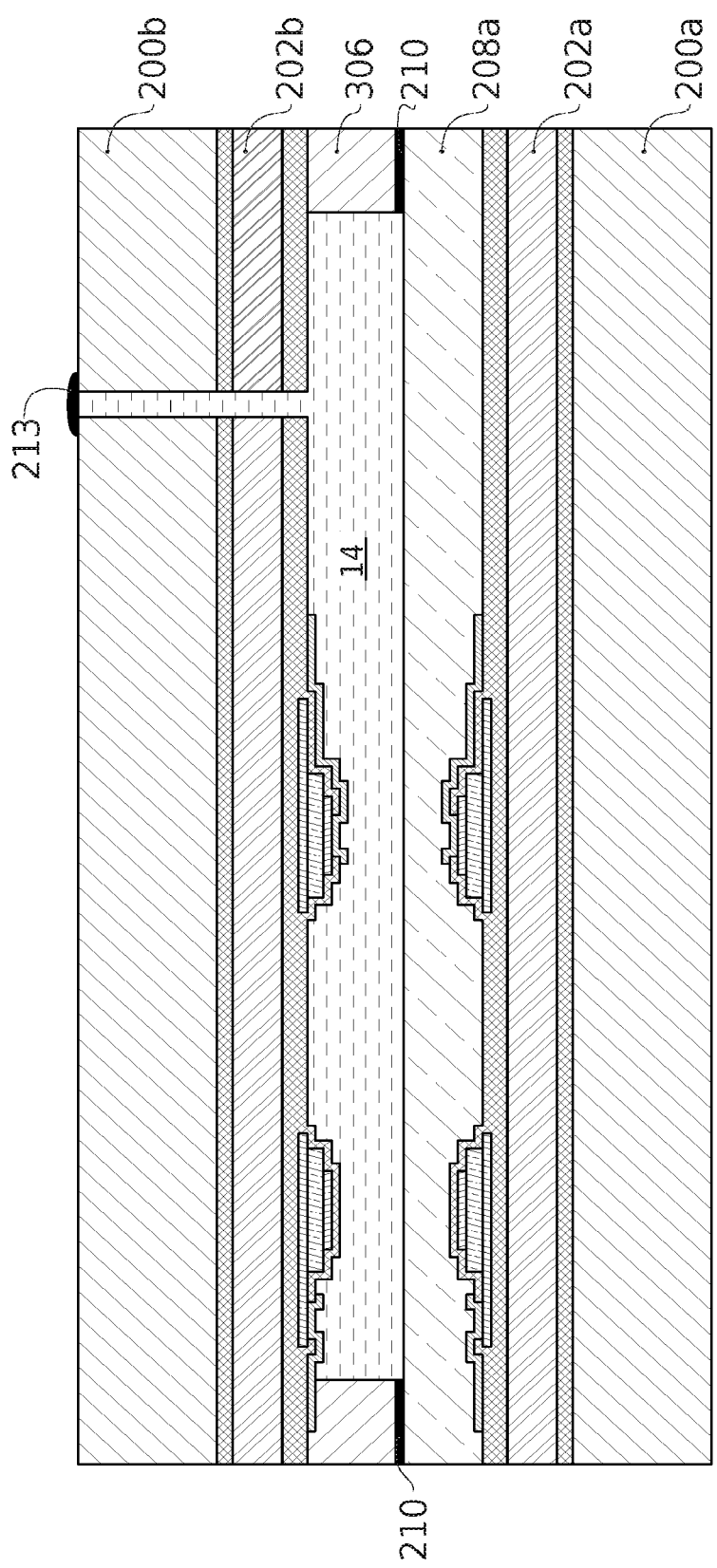

The seventh step of the method for manufacturing the electromechanical microsystem 1 as illustrated in FIG. 2A is illustrated in FIG. 9A. It comprises filling, preferably under vacuum, the cavity 13 with the deformable medium 14 as described hereinabove, for example by dispensing through the at least one through vent 212. It also comprises the tight closure of the at least one through vent 212, for example by dispensing a sealing material 213 at the mouth of each through vent 212, the sealing material 213 being for example based on an epoxy glue.

Figure 10A:
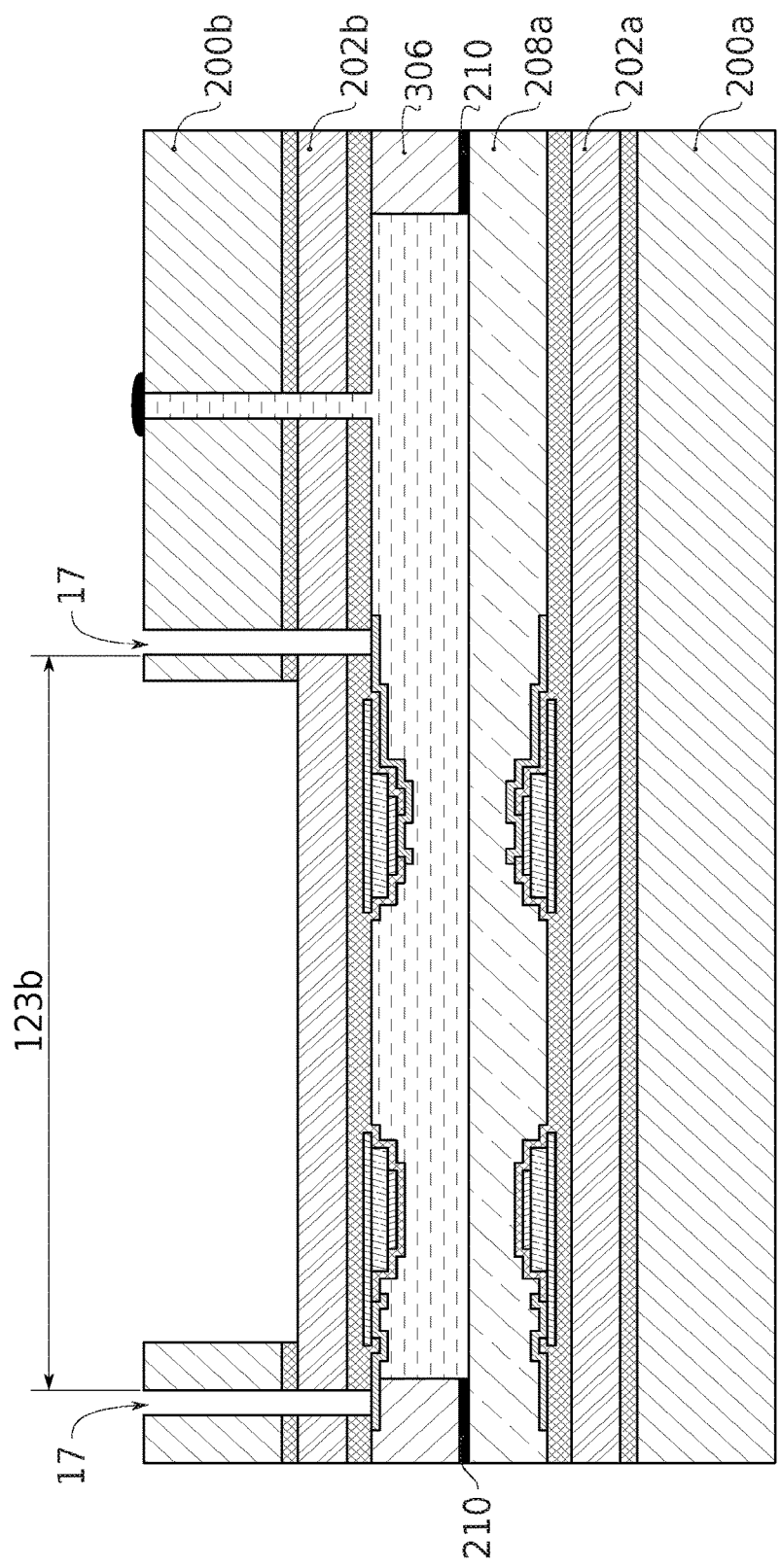

The eighth step of the method for manufacturing the electromechanical microsystem 1 as illustrated in FIG. 2A is illustrated in FIG. 10A. It comprises etching of the second substrate 200b. This etching may be carried out by lithography, and preferably by plasma etching, or by a wet chemical process. Afterwards, it comprises etching of the layer 202b and of the insulating layers 201b, 203b so as to form at least one beam 305b of the second electromechanical transducer 11b.

The ninth step of the method for manufacturing the electromechanical microsystem 1 as illustrated in FIG. 2A is the step allowing obtaining it. It comprises etching of the first substrate 200a. This etching may be carried out by lithography, and preferably by plasma etching, or by a wet chemical process. Afterwards, it comprises etching of the layer 202a and of the insulating layers 201a, 203a so as to form at least one beam 305a of the first electromechanical transducer 11a, expose a portion of the first deformable diaphragm 12a and form all or part of the pin 122a of the possible lateral stops 15a.

Note that, following the above-described steps of manufacturing the electromechanical microsystem 1 as illustrated in FIG. 2A, the pin 122a is in the form of a stack extending directly from the first deformable diaphragm 12a opposite to first cavity 13 while successively presenting the material of the insulating layer 203a, the material forming the beam 305a, the material of the insulating layer 201a and the material forming the first substrate 200a. Also note that, following the above-described steps of manufacturing the electromechanical microsystem 1 as illustrated in FIG. 2A, each of the possible lateral stops 15a is in the form of a stack extending, directly or indirectly, from the first deformable diaphragm 12a opposite to the cavity 13 while successively presenting the material of the insulating layer 203a, the material forming the beam 305a, the material of the insulating layer 201a and the material forming the first substrate 200a.

The method for manufacturing the electromechanical microsystem 1 as illustrated in FIG. 2B is described hereinbelow.

The first five steps of the method for manufacturing the microsystem 1 as illustrated in FIG. 2B are identical to the above-described first five steps of the method for manufacturing the electromechanical 1 as illustrated in FIG. 2A.

Figure 8B:
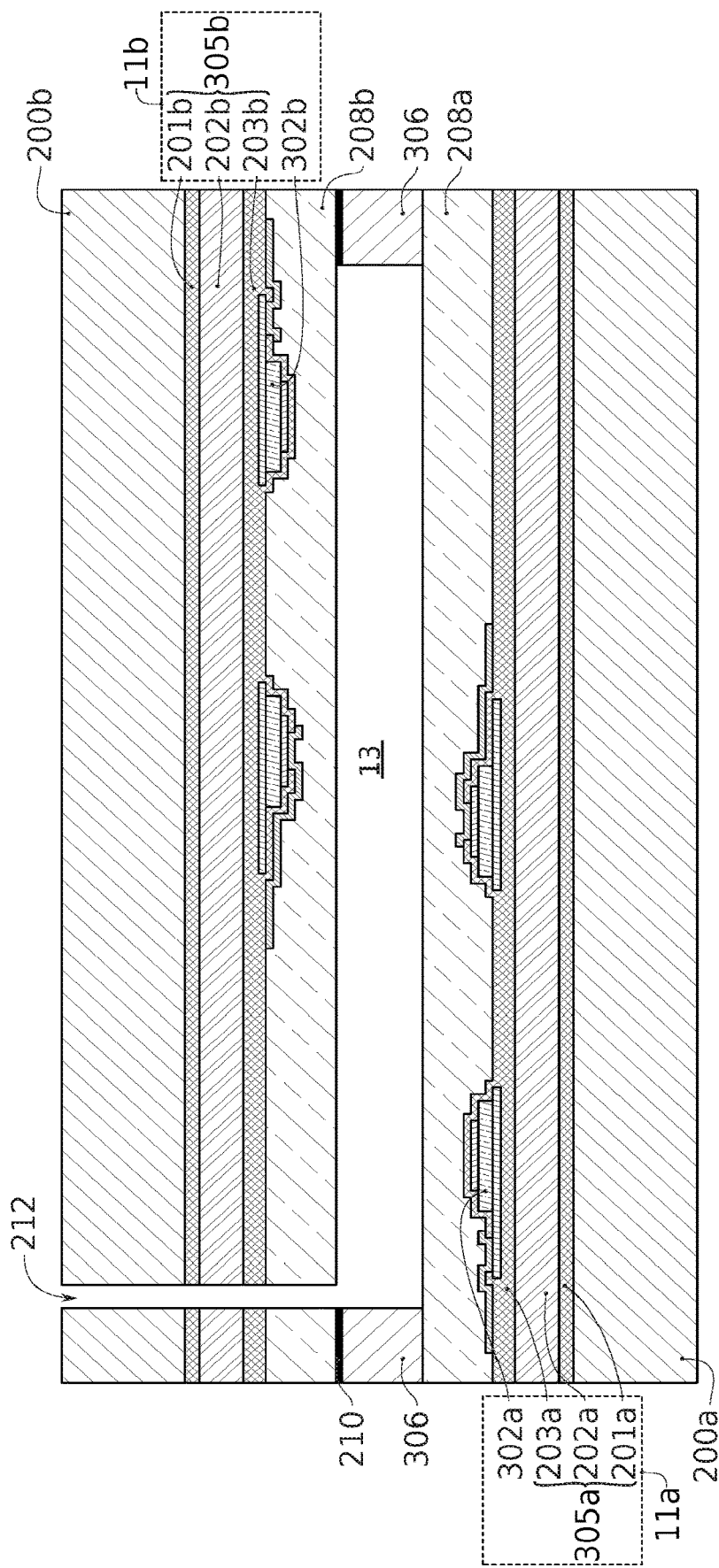

The sixth step of the method for manufacturing the electromechanical microsystem 1 as illustrated in FIG. 2B is illustrated in FIG. 8B. According to an optional embodiment, this step comprises the deposition of glue 210 at the top of each spacer 306, this deposition could be carried by screen-printing or by dispensing. It comprises fastening, for example by gluing, at the top of the spacer(s) (possibly through the glue 210), a portion of the second electromechanical transducer 11b on a second substrate 200b. The latter may be structured so as to comprise at least one through vent 212. In an alternative embodiment, depending on the nature of the spacer, the latter could serve as glue. Upon completion of this sixth step, the cavity 13 is formed which is open by at least one through vent 212.

More particularly, said portion of the second electromechanical transducer 11b could have been obtained through a deposition of a stack of layers extending over the second substrate 200b, and more particularly over its face intended to be affixed opposite to the first substrate 200a. This stack of layers may successively comprise:

a first insulating layer 201b, for example based on silicon oxide, which may be deposited by Plasma-Enhanced Chemical Vapour Deposition (or PECVD), a layer 202b intended to form the beam 305b of the second electromechanical transducer 11b, this layer 202b being for example based on amorphous silicon and may be deposited by Chemical Vapour Deposition (or CVD) at subatmospheric pressure (or LPCVD), a second insulating layer 203b, for example based on silicon oxide and which may be deposited by PECVD, a layer intended to form a so-called lower electrode, for example based on platinum and which may be deposited by Physical Vapour Deposition (or PVD), a layer made of a piezoelectric material, for example based on PZT, and which may be deposited through sol-gel process, and a layer intended to form a so-called upper electrode, for example based on platinum and which may be deposited by PVD, etching of the layer intended to form a so-called upper electrode so as to form the upper electrode 301b of the second electromechanical transducer 11b, etching of the layer made of a piezoelectric material so as to form the piezoelectric elements 302b of the second electromechanical transducer 11b, etching of the layer intended to form a so-called lower electrode so as to form the lower electrode 303b of the second electromechanical transducer 11b, the deposition of a passivation layer, for example based on silicon oxide and/or silicon nitride, may be deposited by PECVD, opening, through the passivation layer, of an area for resuming contact per electrode, this opening may be carried out for example by lithography, and preferably by plasma etching, or by a wet chemical process, the deposition of a layer intended to form an electric line 304b per electrode, the layer being for example based on gold and may be deposited by PVD, etching of the previously deposited layer so as to form an electric line 304b per electrode, this etching being carried out for example by lithography, and preferably by plasma etching, or by a wet chemical process, and the deposition of a polymer-based layer 208b intended to form the second deformable diaphragm 12b. For example, this layer 208b is deposited by spin coating. For example, the polymer based on which the layer 208b is formed is based on PDMS.

Figure 9B:
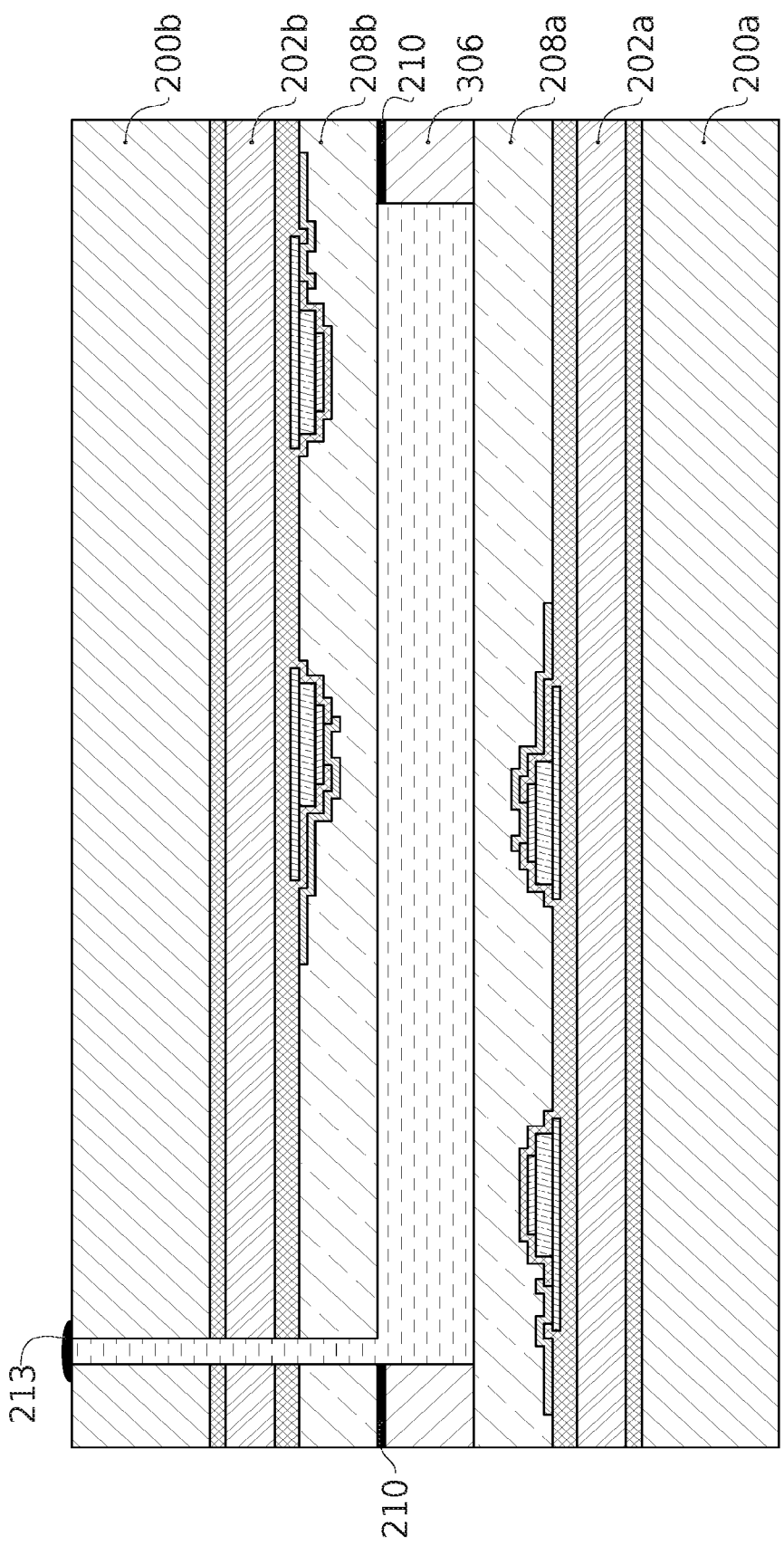

The seventh step of the method for manufacturing the electromechanical microsystem 1 as illustrated in FIG. 2B is illustrated in FIG. 9B. It comprises filling, preferably under vacuum, the cavity 13 with the deformable medium 14 as described hereinabove, for example by dispensing through the at least one through vent 212. It also comprises the tight closure of the at least one through vent 212, for example by dispensing a sealing material 213 at least at the mouth of each through vent 212, the sealing material 213 being for example based on an epoxy glue.

Figure 10B:
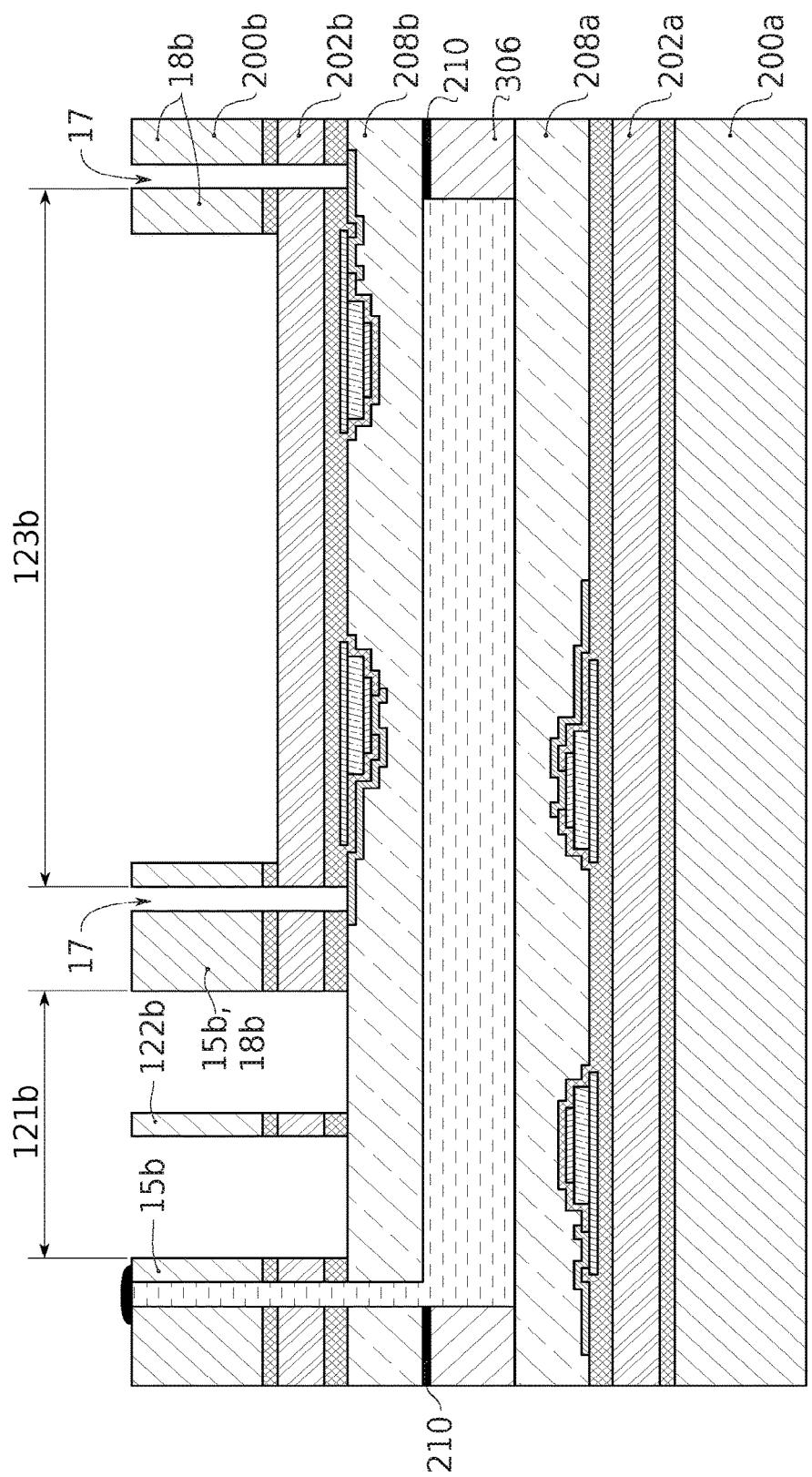

The eighth step of the method for manufacturing the electromechanical microsystem 1 as illustrated in FIG. 2B is illustrated in FIG. 10B. It comprises etching of the second substrate 200b. This etching may be carried out by lithography, and preferably by plasma etching, or by a wet chemical process. Afterwards, it comprises etching of the layer 202b and of the insulating layers 201b, 203b so as to form at least one beam 305b of the second electromechanical transducer 11b, expose a portion of the second deformable diaphragm 12b and form all or part of the pin 122b of the possible lateral stops 15b.

The ninth step of the method for manufacturing the electromechanical microsystem 1 as illustrated in FIG. 2B is the step allowing obtaining it. It comprises etching of the first substrate 200a. This etching may be carried out by lithography, and preferably by plasma etching, or by a wet chemical process. Afterwards, it comprises etching of the layer 202b and of the insulating layers 201b, 203b so as to form at least one beam 305a of the first electromechanical transducer 11a, expose a portion of the first deformable diaphragm 12a and form all or part of the pin 122a of the possible lateral stops 15a.

Note that, following the above-described steps of manufacturing the electromechanical microsystem 1 as illustrated in FIG. 2B, the pin 122b is in the form of a stack extending directly from the second deformable diaphragm 12b opposite to first cavity 13 while successively presenting the material of the insulating layer 203b, the material forming the beam 305b, the material of the insulating layer 201b and the material forming the second substrate 200b. Also note that, following the above-described steps of manufacturing the electromechanical microsystem 1 as illustrated in FIG. 2A, each of the possible lateral stops 15b is in the form of a stack extending, directly or indirectly, from the second deformable diaphragm 12b opposite to the cavity 13 while successively presenting the material of the insulating layer 203a, the material forming the beam 305a, the material of the insulating layer 201a and the material forming the second substrate 200b.

Figure 11A:
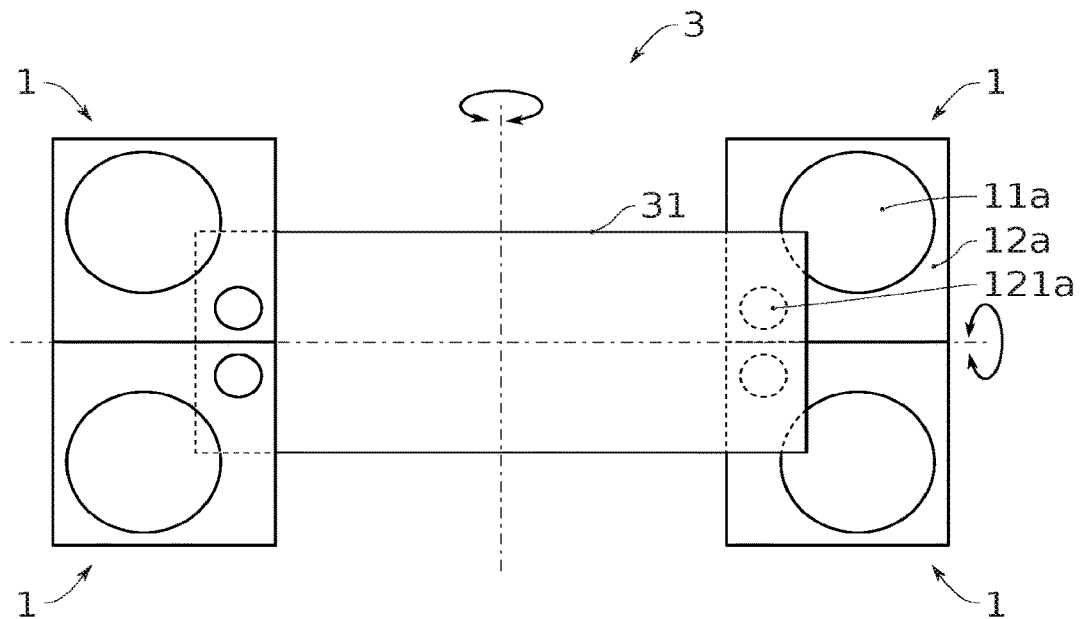
FIGS. 11A and 11B schematically represent, each, an opto-electro-mechanical microsystem according to an embodiment of the invention.
Figure 11B:
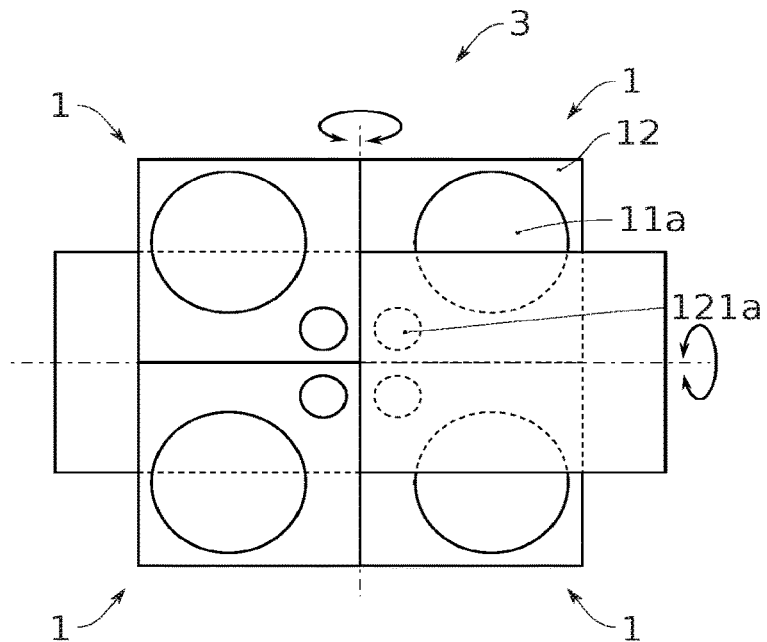

Another aspect of the invention relates to an opto-electromechanical system 3 as illustrated in FIGS. 11A and 11B. It may consist of an opto-electro-mechanical microsystem 3. Each of the opto-electro-mechanical microsystems 3 illustrated in these figures comprises at least one electromechanical microsystem 1 as described hereinabove and at least one optical microsystem 31. The optical microsystem 31 may comprise a silicon-based micro-mirror, whose surface is, where appropriate, topped by a mirror. It may be mounted directly over the electromechanical microsystem 1 or be mounted therein through a frame. It may have dimensions substantially equal to 2 mm×5 mm and/or, at most, a thickness of about 700 μm. Each of the opto-electro-mechanical microsystems 3 as illustrated comprises four electromechanical microsystems 1 each having a free area 121 arranged opposite a portion of the same optical microsystem 31, this portion being specific thereto and being preferably a corner of said optical microsystem 31 or a corner of its centre. Thus, an opto-electro-mechanical microsystem 3 allowing for a broad capability of adaptation of its optical orientation is obtained.

The invention is not limited to the previously-described embodiments and extends to all embodiments covered by the claims.

In particular, the pin 122a, 122b is not necessarily fastened at the centre of the free area 121a, 121b of the deformable diaphragm 12a, 12b. One or several pins 122a, 122b may be positioned in an offset manner over the free area 121a, 121b.

In particular, applications other than those described hereinabove may be considered. For example, the electromechanical microsystem 1 may be arranged in a micropump, and possibly in a system with an array of micropumps, in a haptic system, in a system for self-assembling microelectronic components or in a vibratory, and possibly acoustic, diaphragm system. Furthermore, it is possible to consider the electromechanical microsystem 1 being adapted for achieving a gear motion.

The invention claimed is:

1. An electromechanical microsystem comprising:
    at least two electromechanical transducers each comprising a portion movable between a balance position, off-load, and an out-of-balance position, under load,
    a first deformable diaphragm,
    a deformable cavity formed by walls, the walls being configured to hermetically contain a deformable medium capable of keeping a substantially constant volume under the action of a change in the external pressure,
    wherein at least one portion of the first deformable diaphragm forms at least one portion of a first wall selected amongst said walls of the cavity, wherein the movable portion of each electromechanical transducer is configured so that its movement depends on said change in the external pressure and vice versa, and wherein said at least one portion of the first deformable diaphragm has at least one area freely deformable as a function of said change in the external pressure, the electromechanical microsystem being further such that:
    a first electromechanical transducer forms a portion of said first wall of the cavity, and
    a second electromechanical transducer forms at least one portion of the wall opposite to said first wall of the cavity, and,
    wherein the free area of each deformable diaphragm is configured to cooperate with at least one external member via at least one pin fastened on said free area.

2. The electromechanical microsystem according to claim 1, wherein
    the movable portion of each electromechanical transducer is configured so that its loading or an increase in the external pressure induces its movement towards the outside of the cavity, or
    the movable portion of each electromechanical transducer is configured so that its loading or a decrease in the external pressure induces its movement towards the inside of the cavity.

3. The electromechanical microsystem according to claim 1, wherein the first electromechanical transducer extends over the first deformable diaphragm.

4. The electromechanical microsystem according to claim 1, wherein the first electromechanical transducer extends around the free area of the first deformable diaphragm.

5. The electromechanical microsystem according to claim 1, wherein the first electromechanical transducer extends in a solid area separate from the free area of the first deformable diaphragm.

6. The electromechanical microsystem according to claim 1, further comprising a second deformable diaphragm at least one portion of which forms at least one portion of the wall opposite to said first wall of the cavity and wherein said at least one portion of the second deformable diaphragm has at least one free area adapted to be deformed as a function of said change in the external pressure.

7. The electromechanical microsystem according to claim 6, wherein the second electromechanical transducer extends over the second deformable diaphragm.

8. The electromechanical microsystem according to claim 6, wherein the second electromechanical transducer extends around the free area of the second deformable diaphragm.

9. The electromechanical microsystem according to claim 6, wherein the second electromechanical transducer extends in a solid area separate from the free area of the second deformable diaphragm.

10. The electromechanical microsystem according to claim 1, wherein the pin is fastened at the centre of the free area of the deformable diaphragm on which the pin is fastened.

11. The electromechanical microsystem according to claim 1, wherein each deformable diaphragm is configured so that its free area could be deformed with an amplitude of at least 50 µm, and possibly of about 100 µm, according to a direction perpendicular to the plane in which it primarily extends when it is at rest.

12. The electromechanical microsystem according to claim 1, wherein the movable portion of each electromechanical transducer has a surface at least twice as large as a surface of the free area of at least one deformable diaphragm.

13. An opto-electro-mechanical system comprising at least one electromechanical microsystem according to claim 1, and at least one optical microsystem, wherein said at least one optical microsystem comprises at least one mirror, the opto-electro-mechanical system being configured so that the movement of the movable portion of each electromechanical transducer causes a displacement, a holding or a release of the at least one mirror.

* * * * *